US007683452B2

(12) United States Patent
Ohkawa et al.

(10) Patent No.: US 7,683,452 B2
(45) Date of Patent: Mar. 23, 2010

(54) THRESHOLD VOLTAGE MODULATION IMAGE SENSOR

(75) Inventors: Narumi Ohkawa, Kawasaki (JP); Masayoshi Asano, Kawasaki (JP); Toshio Nomura, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 420 days.

(21) Appl. No.: 11/089,366

(22) Filed: Mar. 25, 2005

(65) Prior Publication Data

US 2005/0285165 A1    Dec. 29, 2005

(30) Foreign Application Priority Data

Jun. 29, 2004   (JP)   .............................. 2004-190853

(51) Int. Cl.
*H01L 27/146*   (2006.01)
(52) U.S. Cl. .............................. 257/459; 257/E27.131
(58) Field of Classification Search ................. 257/292, 257/401, 459, E27.131
See application file for complete search history.

(56) References Cited

U.S. PATENT DOCUMENTS

| | | | | |
|---|---|---|---|---|
| 4,878,120 | A * | 10/1989 | Matsumoto et al. | ......... 348/307 |
| 5,869,352 | A * | 2/1999 | Maruyama et al. | ............ 438/79 |
| 6,051,857 | A | 4/2000 | Miida | |
| 6,448,596 | B1 * | 9/2002 | Kawajiri et al. | ............. 257/292 |
| 6,489,658 | B2 * | 12/2002 | Richter et al. | ............... 257/401 |
| 6,512,547 | B1 | 1/2003 | Miida | |
| 6,914,228 | B2 * | 7/2005 | Yato | ........................ 250/208.1 |
| 6,946,638 | B2 * | 9/2005 | Kuwazawa et al. | ....... 250/208.1 |
| 7,052,928 | B2 * | 5/2006 | Konishi et al. | ................ 438/57 |
| 7,132,705 | B2 * | 11/2006 | Kuwazawa | .................. 257/292 |
| 7,132,706 | B2 * | 11/2006 | Kuwazawa | .................. 257/292 |
| 7,285,764 | B2 * | 10/2007 | Kuwazawa et al. | ....... 250/208.1 |

FOREIGN PATENT DOCUMENTS

| | | | |
|---|---|---|---|
| JP | 08125155 A | * | 5/1996 |
| JP | 11-195778 | | 7/1999 |
| JP | 2002-50753 A | | 2/2002 |
| JP | 2002-329856 | | 11/2002 |
| JP | 2002-353433 | | 12/2002 |
| KR | 2002-33493 A | | 5/2002 |

OTHER PUBLICATIONS

Office Action dated Jun. 3, 2008 issued in corresponding Japanese Application No. 2004-190853.

* cited by examiner

*Primary Examiner*—Lynne A. Gurley
*Assistant Examiner*—Colleen A Matthews
(74) *Attorney, Agent, or Firm*—Westerman, Hattori, Daniels & Adrian, LLP

(57) ABSTRACT

An image sensor has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region; a first conductivity type well region linked to the photoelectric conversion region; a ring-like gate electrode; a second conductivity type source region at the inside of the ring-like gate electrode; a second conductivity type drain region. The image sensor further includes a potential pocket region that is formed in the well region below the ring-like gate electrode and accumulates the electrical charge, wherein the width of the gate electrode is formed narrower in the part adjacent to the photoelectric conversion region than in other parts.

11 Claims, 32 Drawing Sheets

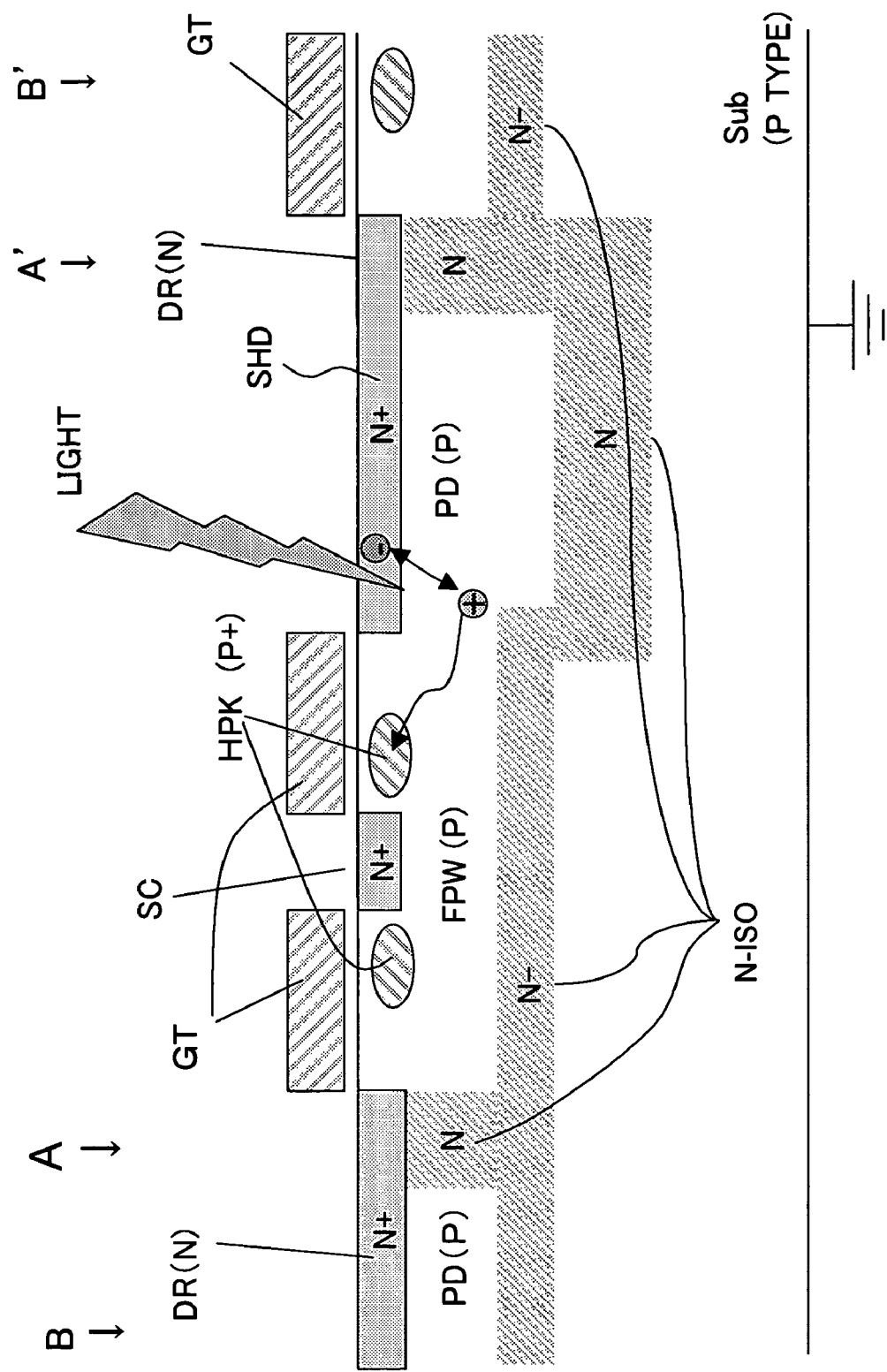
FIG. 2  A-A', B-B' CROSS-SECTIONAL VIEW

FIG. 3B  A-A' CROSS-SECTIONAL VIEW
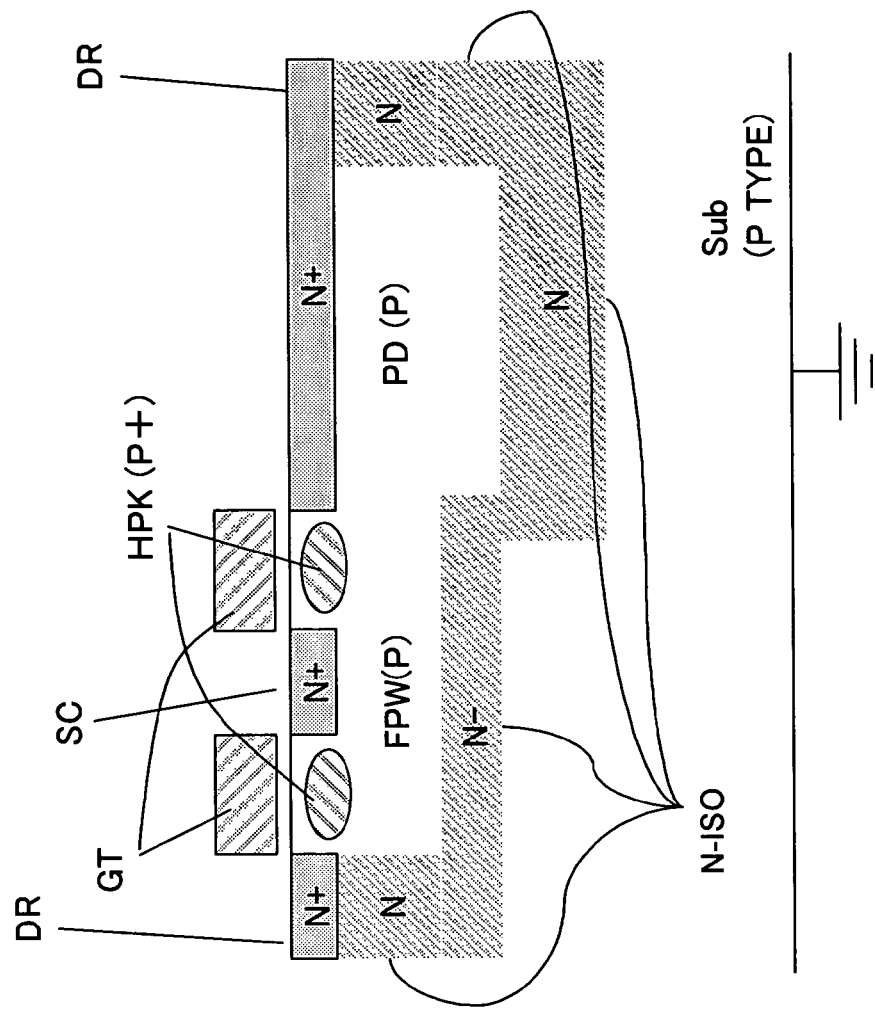
FIG. 3A  PLANAR VIEW
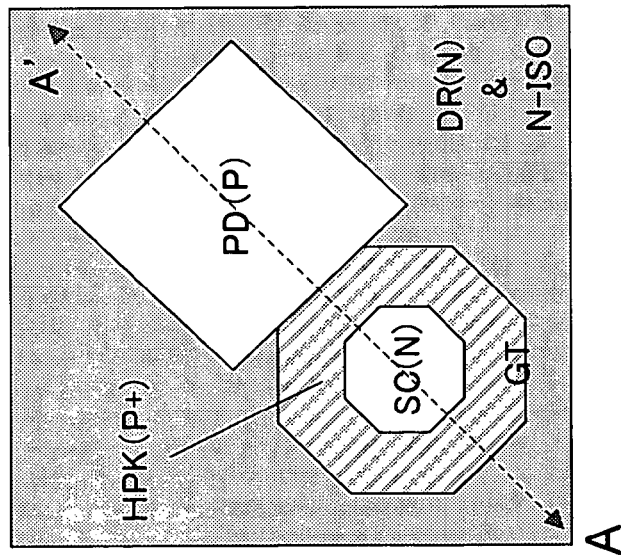

FIG. 4A CROSS-SECTIONAL VIEW
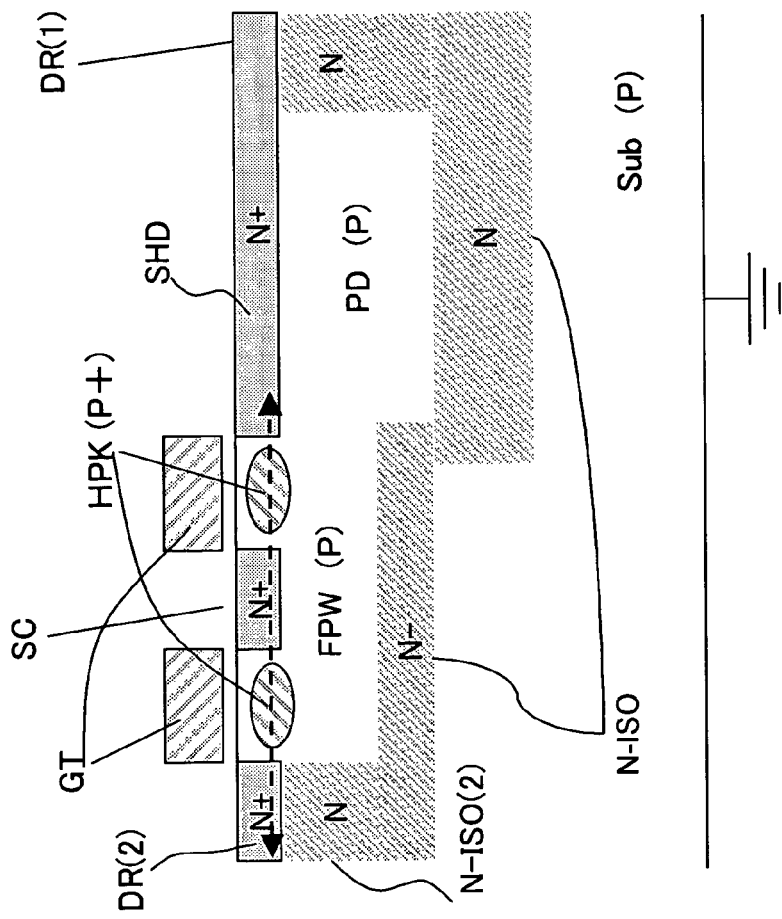
FIG. 4B HOLE POTENTIAL DIAGRAM
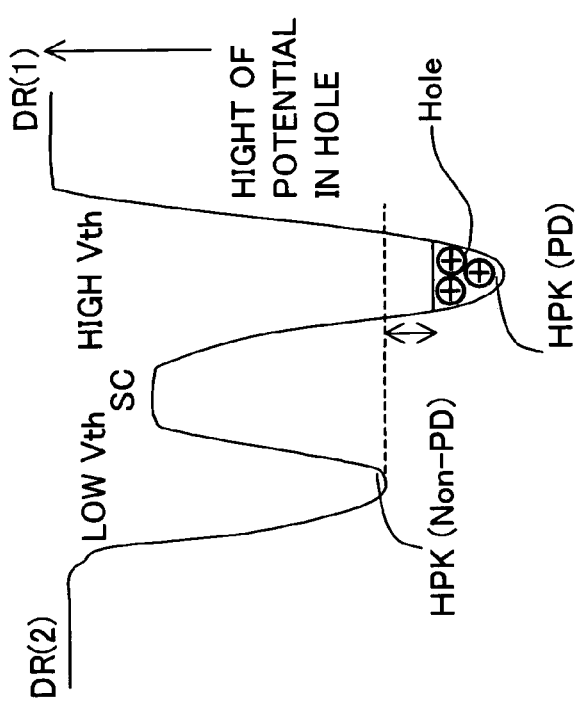

HOLE POTENTIAL DIAGRAM

CROSS-SECTIONAL VIEW

FIG. 6B  A-A' CROSS-SECTIONAL VIEW
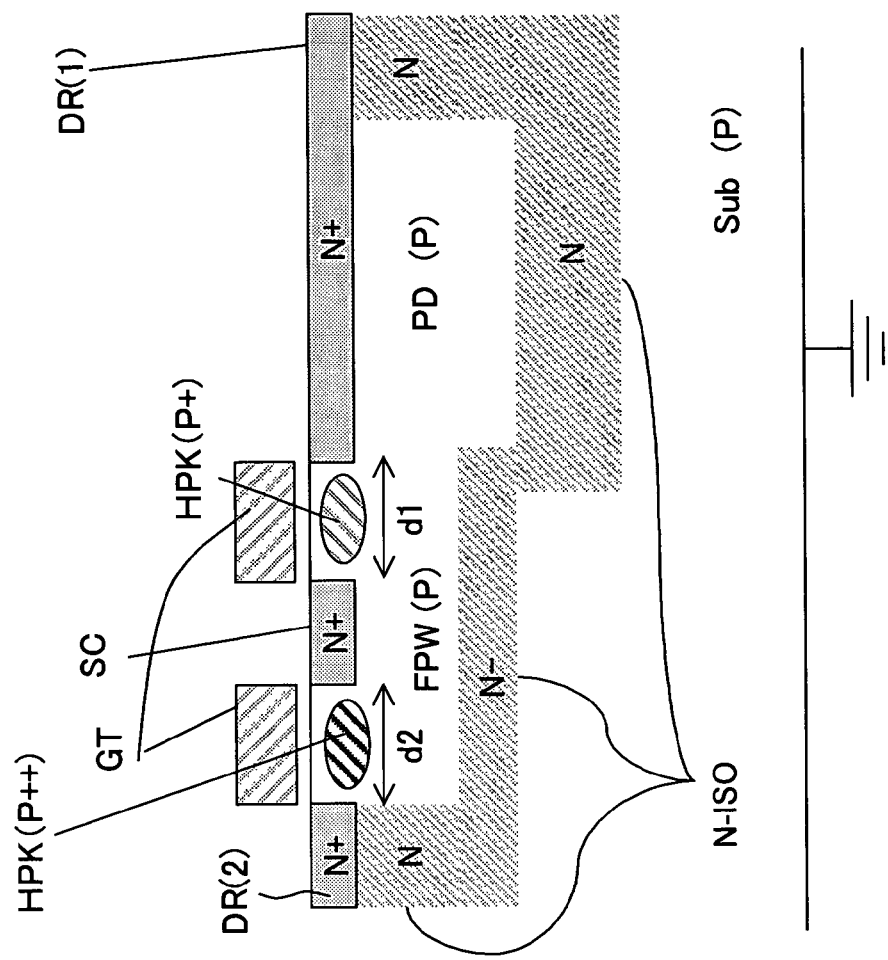
FIG. 6A  PLANAR VIEW
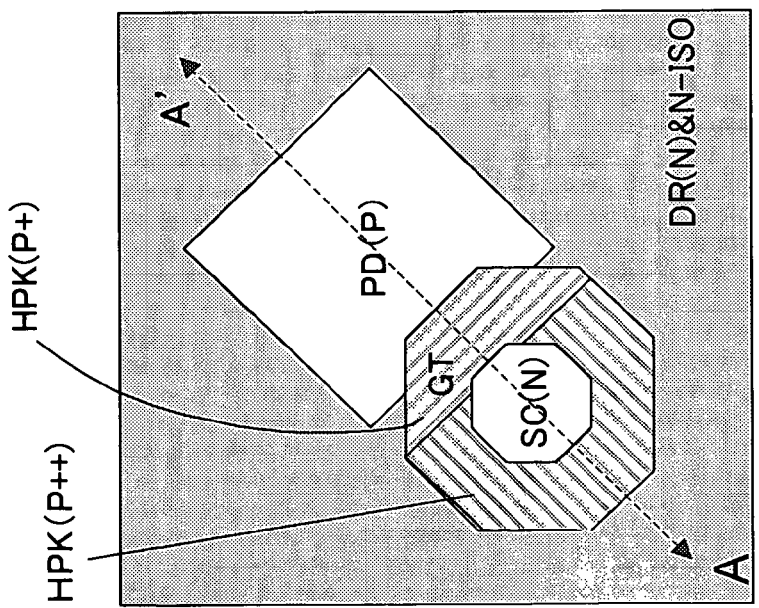

A-A' CROSS-SECTIONAL VIEW

PLANAR VIEW

OVERALL CONSTITUTIONAL VIEW

PIXEL CIRCUIT

FIG. 9
| | PIXEL PORTION | LOGIC CIRCUIT PORTION |
|---|---|---|
| STEP A | Logic P-Well, N-Well FORMED 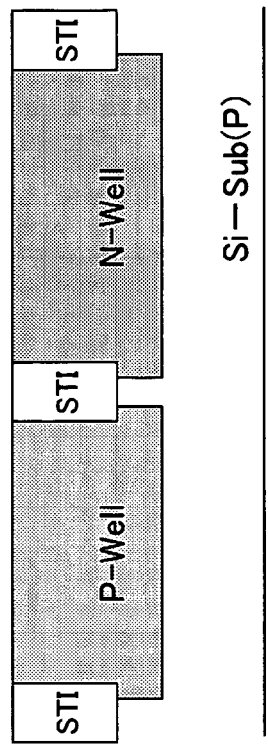 | 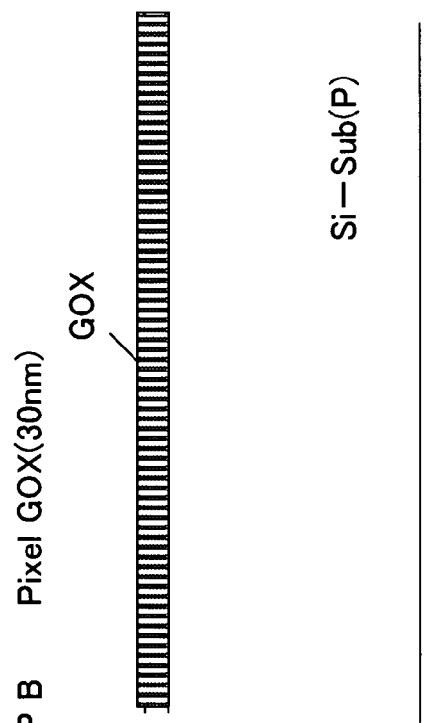 |
| STEP B | Pixel GOX(30nm) 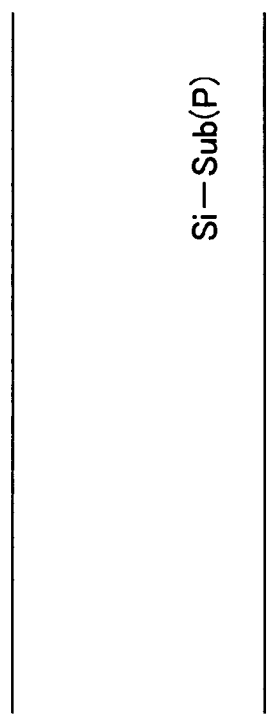 | 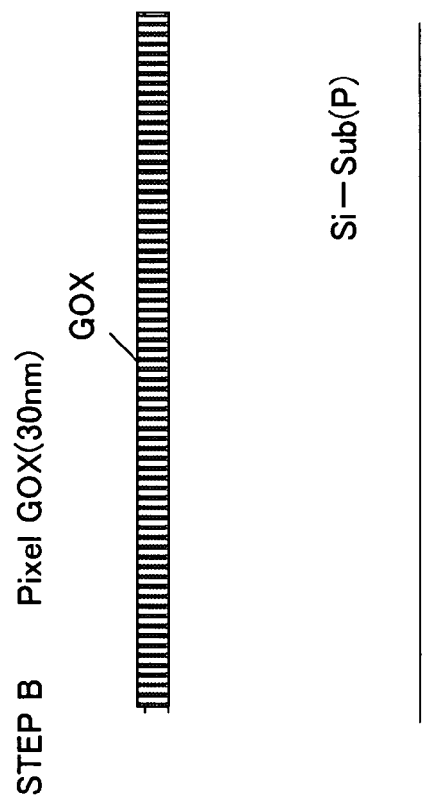 |

FIG. 11 STEP D

STEP E

STEP F

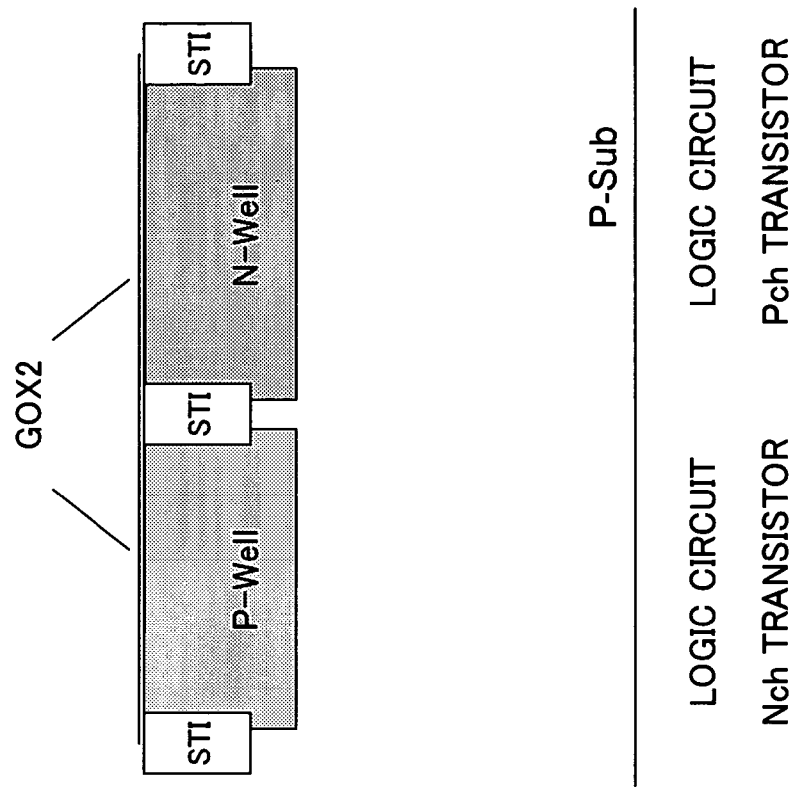
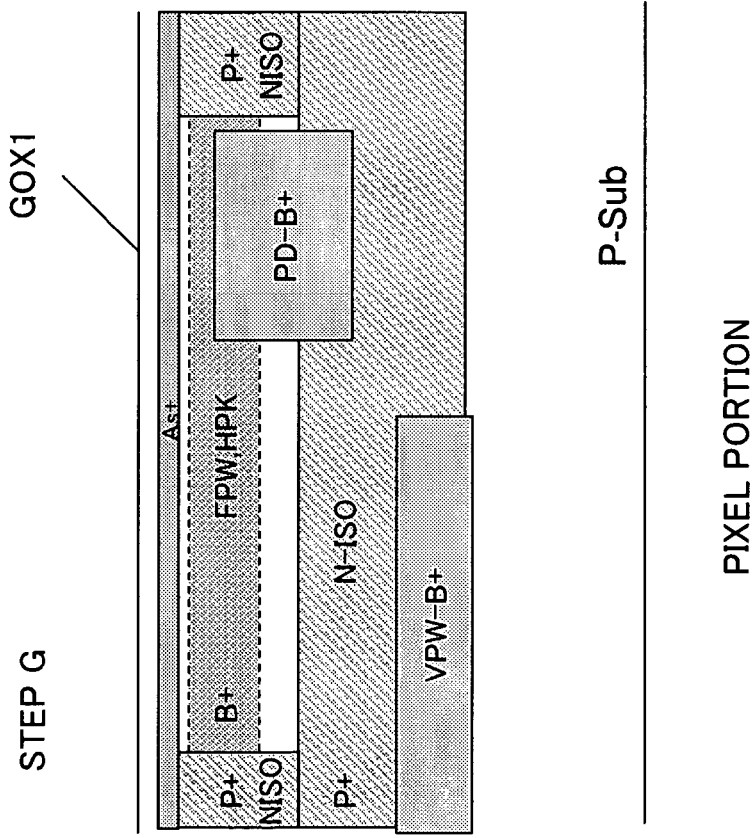
FIG. 16
STEP G

STEP H

STEP H

FIG. 19 STEP I

STEP K

FIG. 25 STEP L

FIG. 26 METHOD OF DRIVING VMIS

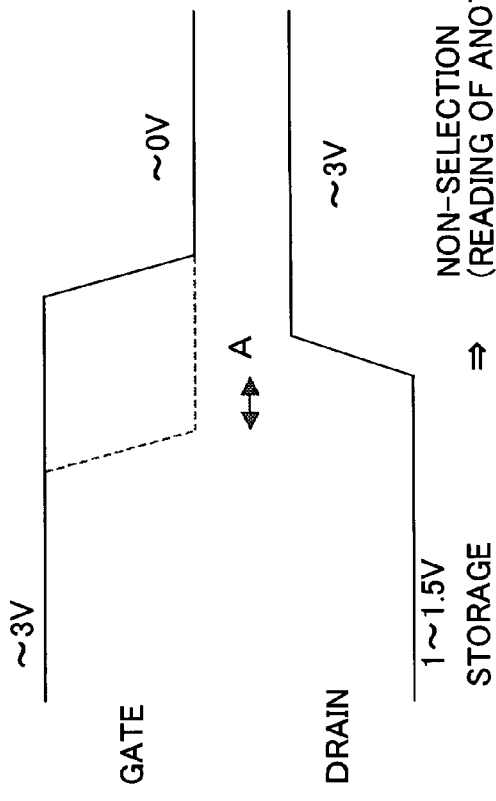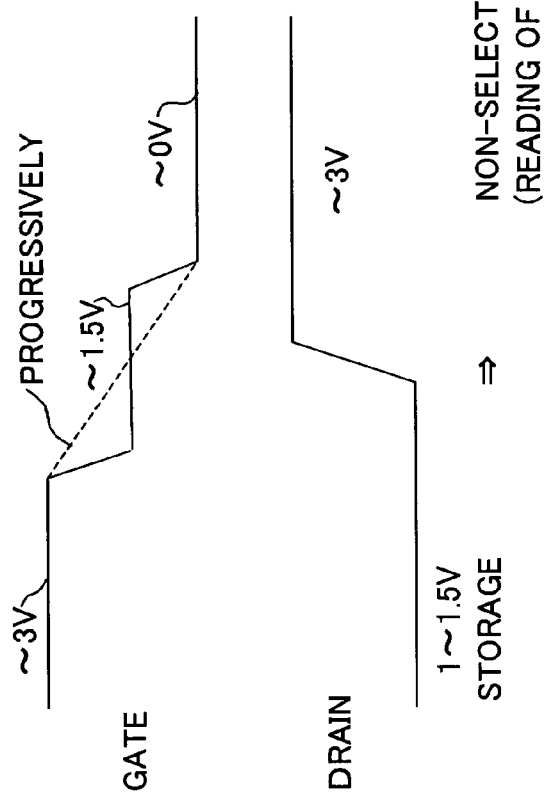

THRESHOLD VOLTAGE MODULATION IMAGE SENSOR

CROSS-REFERENCE TO RELATED APPLICATIONS

This application is based upon and claims the benefit of priority from the prior Japanese Patent Application No. 2004-190853, filed on Jun. 29, 2004, the entire contents of which are incorporated herein by reference.

BACKGROUND OF THE INVENTION

1. Field of the Invention

The present invention relates to a threshold voltage (Vth) modulation image sensor and, more particularly, to a Vth modulation image sensor that permits pixel miniaturization.

2. Description of the Related Art

Image sensors that employ CCD are widely used. However, CCD image sensors have a complex pixel structure and require a process that is different from an ordinary CMOS process. It is therefore not easy to incorporate a CCD image sensor in the same chip as that of a peripheral signal processing circuit. On the other hand, as an image sensor that can be fabricated by means of a CMOS process, a CMOS image sensor has been proposed. A general CMOS image sensor comprises, in a single pixel, a plurality of transistors and a photoelectric conversion element such as a photodiode, and hence miniaturization of the pixel size is difficult.

As means for permitting this pixel miniaturization, a Vth modulation image sensor that uses Vth modulation of a MOS transistor according to the amount of light received has been proposed. For example, such an image sensor is disclosed by Japanese Patent Application Laid Open Nos. H11-195778, 2002-353433, and 2002-329856. In a Vth modulation CMOS sensor, electrical charge (carriers such as holes, electrons, and so forth) is generated by a photodiode that is formed in a well region common to a detection transistor, the charge is accumulated in the well region, and the variation in the threshold voltage of the detection MOS transistor that accompanies this electrical charge accumulation is then outputted as an image signal. Because each pixel is constituted by a single photodiode and a single transistor, the sensor is suited to pixel size miniaturization.

In addition, it has been proposed that the detection transistor be constituted by a ring-like gate electrode, a source region within the ring, and a drain region outside the ring to dispense with a pixel isolation region made of insulation material and suppress a leak current arising from the pixel isolation region. Such an arrangement is shown in FIG. 16 of Japanese Patent Application Laid Open No. 2002-329856, for example. This image sensor forms a potential pocket for the accumulation of electrical charge in a well region, establishes an efficient accumulation of photoelectric converted electrical charge in the potential pocket, and increases the variation in the threshold voltage of the detection transistor caused by the accumulated electrical charge, whereby the sensitivity of the sensor increases.

SUMMARY OF THE INVENTION

Further, in the Vth modulation image sensor, the potential pocket for increasing the sensitivity is established close to the source region in the ring and spaced apart from the drain region. By spacing the potential pocket apart from the drain region, the junction capacity with the drain region is reduced, the variation in the threshold value of the potential pocket region is increased given even a small amount of electrical charge, and the sensitivity is raised.

For this reason, in the channel region below the gate electrode, the potential pocket region is eccentrically located on the source region side and hence the width of the gate electrode is large, which is the main factor preventing pixel miniaturization.

Therefore, an object of the present invention is to provide a Vth modulation image sensor that permits pixel miniaturization.

A further object of the present invention is to provide a Vth modulation image sensor that has a new structure that permits pixel miniaturization.

In order to achieve the above objects, a first aspect of the present invention is an image sensor that has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region below the shield region that constitute the photoelectric conversion element and are formed in a first conductivity type substrate; a first conductivity type well region that is formed in the substrate and linked to the photoelectric conversion region; a ring-like gate electrode formed on the well region; a second conductivity type source region that is formed in the well region and at the inside of the ring-like gate electrode; a second conductivity type drain region that is formed adjacent to the well region and at the outside of the ring-like gate electrode and the photoelectric conversion region. The image sensor further includes a potential pocket region that is formed in the well region below the ring-like gate electrode and accumulates the electrical charge, wherein the width of the gate electrode is formed narrower in the part adjacent to the photoelectric conversion region than in other parts.

In order to achieve the above objects, a second aspect of the present invention is an image sensor that has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region below the shield region that constitute the photoelectric conversion element and are formed in a first conductivity type substrate; a first conductivity type well region that is formed in the substrate and linked to the photoelectric conversion region; a ring-like gate electrode formed on the well region; a second conductivity type source region that is formed in the well region and at the inside of the ring-like gate electrode; and a second conductivity type drain region that is formed adjacent to the well region and at the outside of the ring-like gate electrode and the photoelectric conversion region. The image sensor further includes a potential pocket region that is formed in the well region below the ring-like gate electrode and accumulates the electrical charge, wherein the width of the potential pocket region in the channel direction is formed narrower in the part adjacent to the photoelectric conversion region than in other parts.

In order to achieve the above objects, a third aspect of the present invention is an image sensor that has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region below the shield region that constitute the photoelectric conversion element and are formed in a first conductivity type substrate; a first conductivity type well region that is formed in the substrate and linked to the photoelectric conversion region; a ring-like gate electrode formed on the well region; a second conductivity type source region that is formed in the well region and at the inside of the ring-like gate electrode; a second conductivity type drain region that is formed adjacent to the well region and at the outside of the ring-like gate electrode and the photoelectric conversion region. The image sensor further includes a potential pocket region that is formed in the well region and below the ring-like gate electrode without eccentricity on the source-region side and accumulates the electrical charge, wherein the difference of potential height of the potential pocket region within the ring-like potential pocket region is at most no more than 100 mV.

In order to achieve the above object, a fourth aspect of the present invention is an image sensor that has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region below the shield region that constitute the photoelectric conversion element and are formed in a first conductivity type substrate; a first conductivity type well region that is formed in the substrate and linked to the photoelectric conversion region; a ring-like gate electrode formed on the well region; a second conductivity type source region that is formed in the well region and at the inside of the ring-like gate electrode; a second conductivity type drain region that is formed adjacent to the well region and at the outside of the ring-like gate electrode and the photoelectric conversion region. The image sensor further includes a first conductivity type potential pocket region that is formed in the well region below the ring-like gate electrode and accumulates the electrical charge, wherein the impurity concentration of the potential pocket region is lower in the part adjacent to the photoelectric conversion region than in other part.

In order to achieve the above objects, a fifth aspect of the present invention is an image sensor that has a plurality of pixels each with a photoelectric conversion element and a detection transistor the threshold voltage of which fluctuates in accordance with electrical charge generated in the photoelectric conversion element. The image sensor includes a second conductivity type shield region and a first conductivity type photoelectric conversion region below the shield region that constitute the photoelectric conversion element and are formed in a first conductivity type substrate; a first conductivity type well region that is formed in the substrate and linked to the photoelectric conversion region; a ring-like gate electrode formed on the well region; a second conductivity type source region that is formed in the well region and at the inside of the ring-like gate electrode; a second conductivity type drain region that is formed adjacent to the well region and at the outside of the ring-like gate electrode and the photoelectric conversion region; the image sensor further includes a first conductivity type potential pocket region that is formed in the well region below the ring-like gate electrode and accumulates the electrical charge, wherein the drain region adjacent to the ring-like gate electrode includes a surface region that is formed at the surface of the substrate and adjacent to the potential pocket region, and a deep region that is formed at a region deeper than the surface region and spaced apart from the potential pocket region.

In order to achieve the above objects, a sixth aspect of the present invention is the image sensor according to the first to fifth aspects, further comprising a second conductivity type buried isolation region that is buried between the well region and the substrate and linked to the drain region, wherein, when the transition is made from a first state in which the drain voltage of the drain region is lower than the gate voltage of the gate electrode to a second state in which the drain voltage of the drain region is higher than the gate voltage of the gate electrode, the gate voltage is lowered after first raising the drain voltage.

In order to achieve the above objects, a seventh aspect of the present invention is the image sensor according to the above first to fifth aspects, further comprising a second conductivity type buried isolation region that is buried between the well region and the substrate and linked to the drain region, wherein, when the transition is made from a first state in which the drain voltage of the drain region is lower than the gate voltage of the gate electrode to a second state in which the drain voltage of the drain region is higher than the gate voltage of the gate electrode, the gate voltage is lowered to the second state after rendering the gate voltage an intermediate voltage between the voltages of the first and second states and then raising the drain voltage.

According to aspects 1 to 5 of the present invention above, the potential pocket region can be provided below the gate electrode without shifting to the source-region side and the gate electrode width can be narrowed, whereby the pixel region can be miniaturized. Further, the depth of the potential of the potential pocket region can be made substantially uniform and the light sensitivity can be raised.

In addition, according to aspects 6 and 7 of the present invention above, as a result of the provision of a miniaturized pixel region, the problem posed by a structure in which electrical charge accumulated in the well region due to the fluctuation of the gate voltage is readily released to the substrate side can be avoided.

BRIEF DESCRIPTION OF THE DRAWINGS

FIG. 2 is a cross-sectional view of the Vth modulation image sensor;

FIG. 3 provides a planar view and cross-sectional view of the Vth modulation image sensor;

FIG. 4 illustrates the problems faced by the image sensor of FIG. 3;

FIG. 6 provides a cross-sectional view and a hole potential diagram of the image sensor of a second embodiment;

FIG. 9 shows the fabrication process of the image sensor of this embodiment;

FIG. 16 shows the fabrication process of the image sensor of this embodiment;

FIG. 32 is a waveform diagram showing the driving method of this embodiment.

DESCRIPTION OF THE PREFERRED EMBODIMENTS

Embodiments of the present invention will be described hereinbelow with reference to the drawings. However, the technical scope of the present invention is not limited to or by these embodiments and instead covers the items appearing in the claims and any equivalents thereof.

Figure 1:
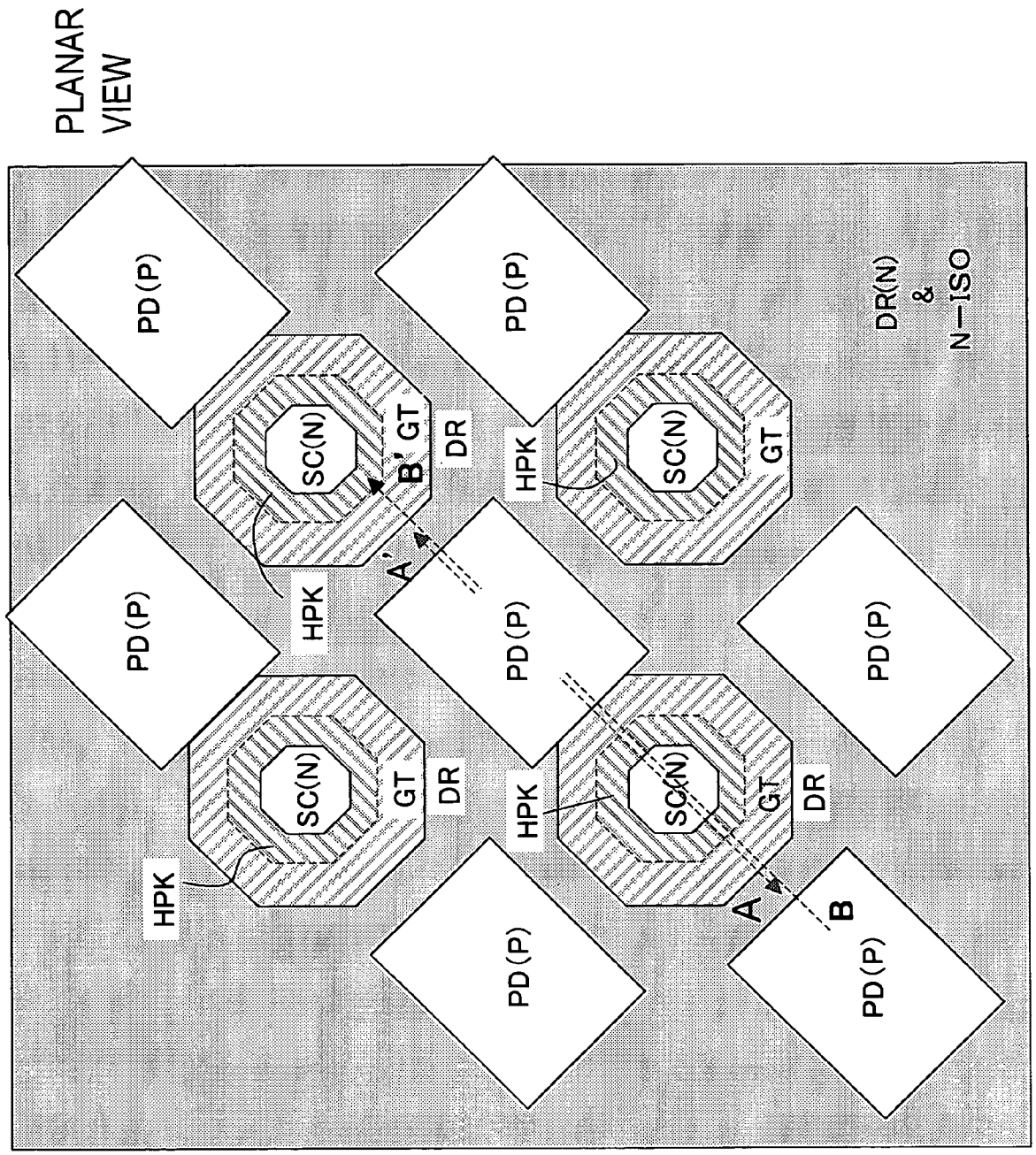
FIG. 1 is a planar view of a Vth modulation image sensor.

FIGS. 1 and 2 provide a planar view of a Vth modulation image sensor (VMIS) and a cross-sectional view thereof respectively. As shown by the planar view of FIG. 1, pixels that each consist of a photodiode PD, which is a photoelectric conversion element, and a detection transistor (consisting of a gate GT, source SC, and drain DR) that is linked to the photodiode PD, are arranged in the form of a matrix. Each detection transistor comprises a ring-like gate GT, a source region SC being provided within the ring-like gate, and a drain region DR being provided outside the ring-like gate GT. Further, the drain region DR surrounds the ring-like gate GT and photodiode PD and is common to all the pixels. Hence, an insulation film isolation region for separating the pixels is not provided.

Further, as shown in the cross-sectional view of FIG. 2, the Vth modulation image sensor comprises an N-type shield region SHD and a P-type photoelectric conversion region PD therebelow that are formed in a P-type substrate Sub to constitute a photoelectric conversion element (photodiode); a P-type well region FPW that is formed in the substrate Sub and linked to the P-type photoelectric conversion region PD; a ring-like gate electrode GT that is formed on the well region FPW; an N-type source region SC within the well region FPW that is formed on the inside of the ring-like gate electrode GT; and an N-type drain region DR that is adjacent to the well region FPW and formed on the outside the ring-like gate electrode GT and photoelectric conversion region PD. The Vth modulation image sensor further comprises a high-density P-type potential pocket region HPK that is below the ring-like gate electrode GT and within the well region FPW, which accumulates electrical charge generated in the photoelectric conversion region PD. The potential pocket region HPK has a higher density than the well region FPW and forms a potential groove for a hole.

The P-type well region FPW and photoelectric conversion region PD are surrounded by an N-type isolation region N-ISO that is buried in a region from the substrate surface to the substrate deep below the substrate surface and are in a floating state electrically isolated from the ground-connected substrate Sub. Further, hole-electron pairs are generated in the photoelectric conversion region PD as a result of light entering the photodiode region. The electrons migrate toward the shield region SHD and the holes accumulate in the potential pocket region HPK in the well region FPW. When holes have accumulated in the potential pocket region HPK, the threshold voltage of the detection transistor drops as a result of the accumulated holes. Therefore, if the drain of the detection transistor is connected to a predetermined high potential and a predetermined potential is applied to the gate to render a source follower, the source voltage rises due to the drop in the threshold voltage and the amount of light can be detected via a source line.

Further, because the detection transistor is an N channel transistor in this example, the potential pocket region HPK is a hole pocket region in which the potential with respect to the holes is lower than that of the surrounding area, the potential pocket region HPK being formed by means of a high-density P-type region in a P well region. Therefore, in cases where the detection transistor is a P channel transistor and the well region is an N-type region, the potential pocket region HPK is a high-density N-type pocket region in which the potential with respect to the electrons is lower.

As is clear from FIGS. 1 and 2, in the case of the image sensor, there is no pixel-isolating insulation material isolation region and the common drain region DR functions as an isolation region for isolating the pixels from each other. By not employing an isolation region that uses a silicon oxide film or the like, leaks caused by defects at the interface between the isolation oxide film and silicon are eliminated and sensitivity to incident light can be raised. Further, an increase in the numerical aperture can also be expected as a result of not employing the isolation region.

As shown by the planar view of FIG. 1 and the cross-sectional view of FIG. 2, the potential pocket region HPK is close to the source region SC in the region below the gate electrode GT and is eccentrically located in a position spaced apart from the drain region DR. By establishing such a constitution, the accumulated electrical charge is concentrated by narrowing the potential pocket region HPK and the variation in the source voltage with respect to the same signal electrical charge amount can be increased. Further, by providing the potential pocket region HPK spaced apart from the drain region DR to which a high positive voltage is applied, the coupling capacity between the potential pocket region HPK and the drain region is reduced and the sensitivity of the variation in the source voltage with respect to the same signal charge amount can be raised.

However, because the potential pocket region HPK described above is inclined toward the source region SC, narrowing the gate width of the gate electrode GT is difficult and miniaturization of the pixel region is troublesome. Therefore, provision of the potential pocket region HPK over the whole of the region below the ring-like gate electrode may be considered while dispensing with the eccentric location of the potential pocket region HPK.

FIG. 3 is a planar view of another Vth modulation image sensor and a cross-sectional view thereof. Reference numerals that are the same as those in FIGS. 1 and 2 have been provided. As shown in the planar view of FIG. 3A and the cross-sectional view of FIG. 3B, the potential pocket region HPK is provided over the whole of the region below the gate electrode GT without eccentricity. By dispensing with the eccentric location of the potential pocket region HPK spaced apart from the drain region as per FIGS. 1 and 2, the width of the gate electrode can be narrowed and thus the pixel area can be reduced.

FIG. 4 shows the problems faced by the image sensor in FIG. 3. FIG. 4A is the same cross-sectional view as that of FIG. 3B and FIG. 4B is a potential diagram for holes in positions indicated by the broken line arrows in the cross-sectional view FIG. 4A. That is, in the direction of the broken line arrows, a drain region DR(1) above the photoelectric conversion region PD, a pocket region HPK (PD) on the side of the photoelectric conversion region PD, a source region SC, a pocket region HPK(Non-PD) outside the photoelectric conversion region PD, and a drain region DR(2) exist. Further, whereas only a shallow N-type drain region DR(1) constituting the shield region SHD is provided in the vicinity of the PD-side pocket region HPK (PD), a shallow drain region DR(2) and isolation region N-ISO(2) provided in the substrate are provided in the vicinity of the pocket region HPK (Non-PD) opposite or outside the photoelectric conversion region PD. Therefore, the pocket region HPK(Non-PD) on the side of the region outside PD is more susceptible to the influence of the high potential of the isolation region N-ISO (2) than the PD-side pocket region HPK(PD) and therefore tends to be a shallow potential pocket, that is, as per FIG. 4B.

Therefore, when a potential pocket region HPK is simply formed in the whole region below the gate electrode, there is then the problem that the respective heights of the potential in the pocket region HPK (PD) close to the photoelectric conversion region PD and in the opposite pocket region HPK (non-PD) close to the isolation region N-ISO (2) provided in the substrate are non-uniform. This potential non-uniformity brings about a drop in the sensitivity to a small amount of light. That is, due to the non-uniformity of the potential of the potential pocket region HPK, holes generated by the small amount of light are first stored in the low-potential region HPK (PD). In this state, as shown in FIG. 4B, the difference in potential between the two potential pocket regions HPK cannot be canceled. As a result, in the case of the ring-like detection transistor, the PD-side threshold value voltage remains higher, the threshold voltage remains non-uniform, and the region in which the threshold voltage drops and the region in which the threshold voltage does not drop are combined. Further, in the case of a source follower-connected detection transistor, the source voltage is limited by the low threshold value voltage. Therefore, even when a high threshold voltage close to the PD region drops somewhat due to the small number of holes, the threshold voltage is low in the region outside the PD region and fluctuations in the source voltage of the detection transistor are not produced. As a result, except after sufficient holes have accumulated in the PD-side potential pocket region HPK and the height of the overall potential has grown uniform, the source voltage does not fluctuate and hence the sensitivity to a small amount of light is poor.

Figure 5B:
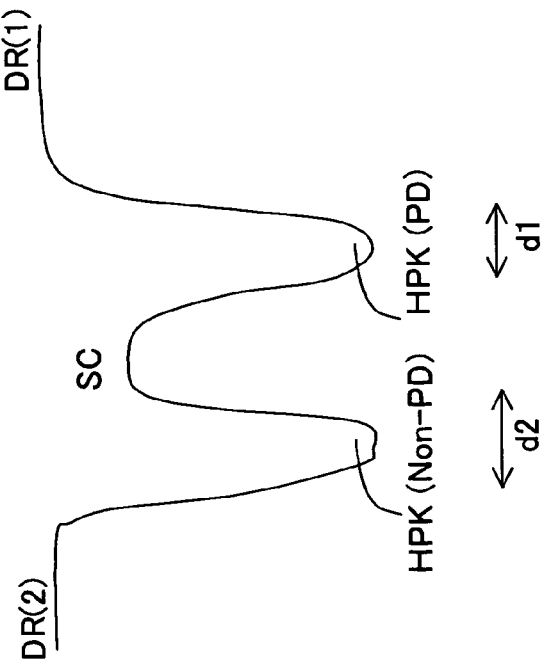
FIG. 5 provides a cross-sectional view and a hole potential diagram of the image sensor of the first embodiment.
Figure 5A:
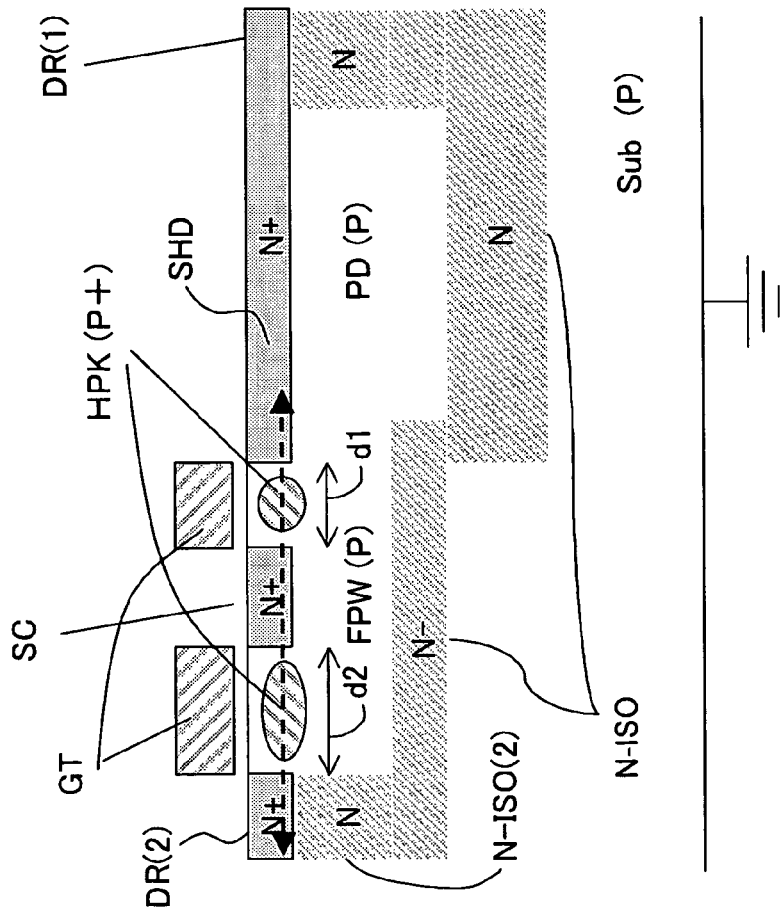

FIG. 5 shows a cross-sectional view and a hole potential diagram of an image sensor of a first embodiment. The planar shape of the image sensor of this embodiment is as per FIG. 3A, but, this planar shape is different in that the width of the gate electrode GT is narrower on the side of the photoelectric conversion region PD. That is, as illustrated by the cross-sectional view in FIG. 5A, the gate width of the gate electrode GT is narrower in part d1 close to the photoelectric conversion region PD than in part d2 outside the photoelectric conversion region PD. Further, a high-density P-type potential pocket region HPK is formed over the whole surface of the floating P-type well region FPW below the gate electrode GT. For this reason, the width d1 of the PD-side potential pocket region HPK(PD) is then narrower than the width d2 of the potential pocket region HPK(Non-PD) on the side of the N-type isolation region N-ISO (2) in the substrate. However, because the potential pocket region HPK is not eccentrically located on the source region side, there is no need to widen the all gate width of the gate electrode.

The depth of the potential of the pocket region becomes deeper moving from the adjacent N-type region DR (1) and source region SC. That is, the form of the potential of the pocket region is determined in accordance with the Poisson equation and the potential at the boundary between the pocket region and surrounding region. So the potential of the pocket region drops substantially as a quadratic function of the distance. Therefore, by narrowing the PD-side gate width, the width of the pocket region HPK (PD) is narrowed, whereby the depth of the potential can be reduced. That is, as shown in the hole potential diagram of FIG. 5B, there is no longer a difference in the potential depth of the potential pocket region HPK. As a result, the non-uniformity in the depth of the potential of the pocket region HPK below the ring-like gate electrode GT can be canceled. Preferably, the difference in the depth of the potential desirably lies within a range of about 100 mV, for example, over the whole ring width.

FIG. 6 provides a cross-sectional view and a hole potential diagram of the image sensor of the second embodiment. In this example, the widths d1 and d2 of the ring-like gate electrode GT are substantially constant or equal and the width of the potential pocket region HPK is substantially constant or equal. However, the P-type impurity concentration of the PD-side potential pocket region HPK (P+) is made lower than the P-type impurity concentration of the potential pocket region HPK (P++) that is adjacent to the N-type isolation region N-ISO(2) in the substrate outside the PD region. As per the planar and cross-sectional views, the pocket region HPK is such that the PD-side region is P+ (high-density P-type region) and the remaining region is P++ (a higher density P-type region). Thus, by providing such a difference in density, the potential depth of the PD-side pocket region can be made shallow and the potential non-uniformity with respect to the pocket region HPK close to the isolation region N-ISO (2) in the substrate can be avoided.

The specific process for this fabrication involves, in the subsequently-described ion implantation that forms the pocket region, performing ion implantation of B ions at substantially 35 keV, 4.3E12 (atm/cm$^2$) into the whole of the ring-like pocket region, and performing ion implantation again with B ions at substantially 35 keV, 0.5E12 into the region other than the region adjacent to the PD region. That is, ion implantation of 4.3E12 into the pocket region adjacent to the PD region and of 4.8E12 into the remaining region is performed, whereby the impurity concentration difference is generated.

Figure 7B:
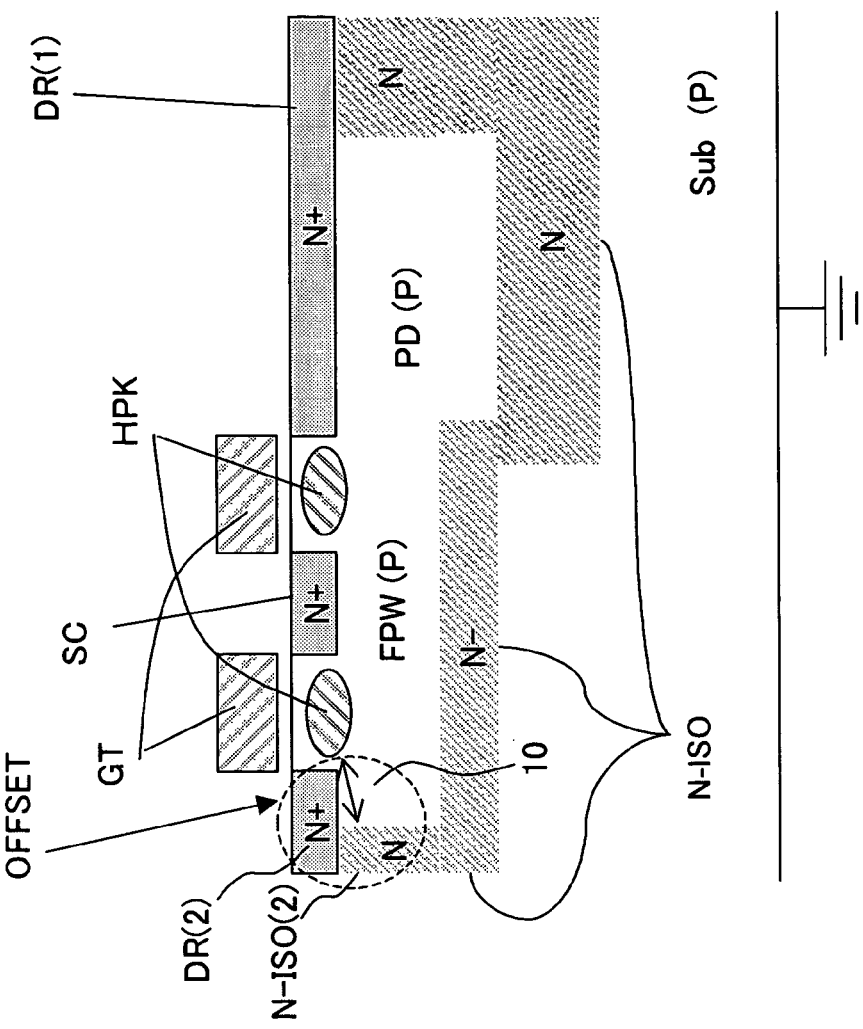
FIG. 7 provides a cross-sectional view and a hole potential diagram of the image sensor of a third embodiment.
Figure 7A:
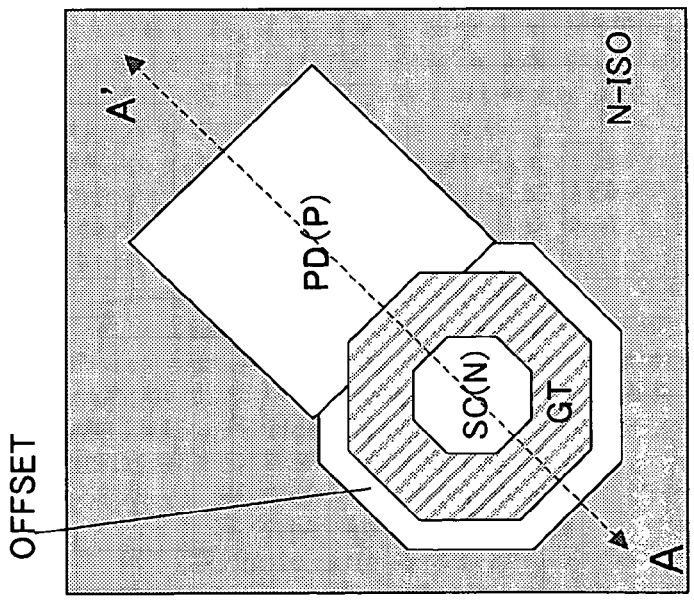

FIG. 7 provides a cross-sectional view and a hole potential diagram of the image sensor of the third embodiment. So too with this example, the widths d1 and d2 of the ring-like gate electrode GT are substantially constant and the width of the potential pocket region HPK is substantially constant. In addition, the impurity concentration is also substantially constant. However, an offset structure OFFSET that spaces the N-type isolation region N-ISO provided in the substrate apart from the gate electrode near the gate electrode GT is provided. That is, the planar view of FIG. 7A illustrates the relationship between the N-type isolation region N-ISO formed in the substrate and the gate electrode GT and photoelectric conversion region PD. However, the N-type isolation region N-ISO is formed with an offset OFFSET in the region of the gate electrode GT that is not adjacent to the photodiode PD. That is, as indicated by the arrow 10 in the cross-sectional view of FIG. 7B, the N-type isolation region N-ISO (2) is provided spaced apart from the pocket region HPK.

As a result of this constitution, the influence on the pocket region HPK exerted by the N-type isolation region N-ISO in the substrate and by the drain DR(1) in PD side is substantially uniform in the whole region of the ring-like pocket region HPK, meaning that, even when the pocket region HPK has the same concentration and the same width, the potential depth is substantially uniform. As a result, the drop in sensitivity to the small light amount mentioned earlier can be suppressed.

The overall constitution of the image sensor, the process steps and the operating principles thereof will be described in order below on the basis of the image sensor according to the first embodiment.

Overall Constitution and Pixel Circuit

Figure 8A:
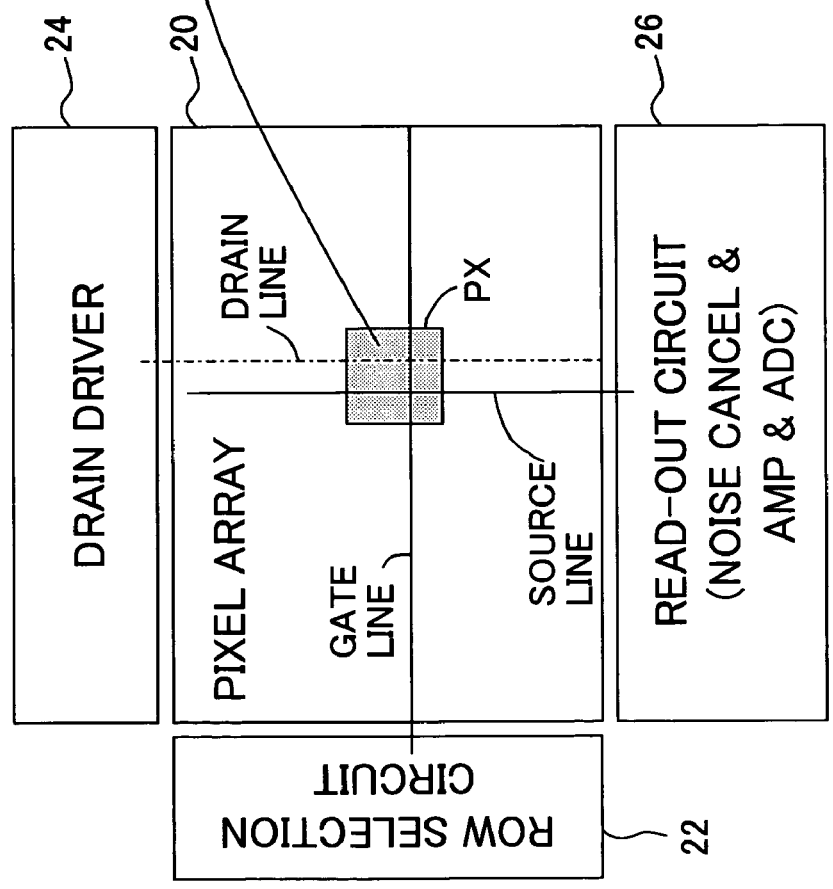
FIG. 8 shows the overall constitution and a pixel circuit of the image sensor of this embodiment.

FIG. 8 shows the overall constitution of the image sensor of this embodiment and the pixel circuit. As shown by the overall constitutional view of FIG. 8A, a gate line Gate that extends in the row direction and a drain line Drain and source line Source that extend in the column direction are provided within a pixel array 20. Pixels PX are provided at the points of intersection between the gate line and drain and source lines. The gate line is driven at a predetermined voltage by a row selection circuit 22, the drain line is driven at a predetermined voltage by a drain driver circuit 24, and the source line is connected to a read-out circuit 26. The read-out circuit 26 detects a source voltage that varies in accordance with the amount of light entering to the pixel, as a read signal.

Figure 8B:
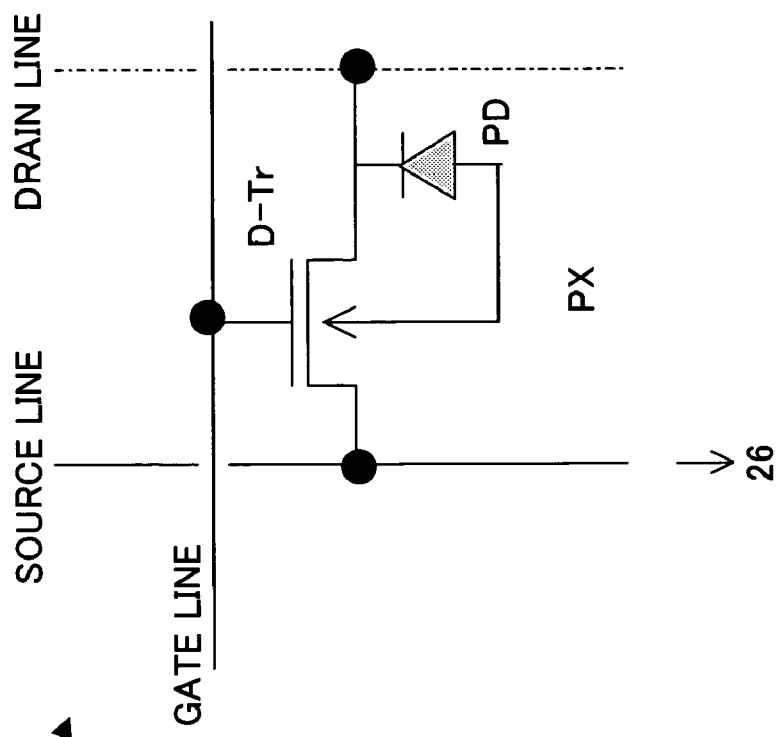

As shown in the pixel circuit diagram in FIG. 8B, the gate, drain and source of the detection transistor D-Tr are connected to the gate line, drain line and source line respectively, and a photodiode PD is formed by a part of N-type region DR(1) of the drain of the detection transistor D-Tr and a P-type photoelectric conversion region PD linked to the P-type well region FPW. This constitution is illustrated by the cross-sectional views of FIGS. 5, 6 and 7. Further, the holes produced in the photoelectric conversion region PD of the photodiode in response to the incident light lower the threshold voltage of the detection transistor D-Tr. In the read state, 3V, for example, is applied to the drain line and gate line, and the voltage of the source line becomes a voltage that is lower than gate voltage by the amount of the threshold voltage. Hence, the drop in the threshold voltage that is caused by the production of holes brings about a rise in the source line voltage and the variation of the source voltage is detected by the reading circuit 26. The constitution of the read-out circuit 26 comprises a correlated double sampling circuit for noise canceling, a source-voltage amplification circuit AMP, and an analog-digital conversion circuit ADC that converts a sampled voltage into a digital signal, for example.

Fabrication Process

The fabrication process of the image sensor of this embodiment will be described by means of FIGS. 9 to 25. As shown in FIG. 8, the image sensor is constituted by a pixel array, and peripheral driver and read-out circuits. Therefore, costs can be reduced if these circuits are formed in the same chip. Thus, in the following description, the pixel portion and a logic circuit that constitutes the peripheral circuit thereof are compared or described individually.

FIG. 9 provides cross-sectional views of the pixel portion on the left-hand side and a logic circuit section on the right-hand side. In step (A), a shallow trench isolation STI used for element isolation is formed at the surface of a P-type silicon substrate Si-Sub on the logic-circuit side. Here, STI is not formed in the pixel portion. The plurality of pixels formed in the pixel portion is element-isolated by the N-type isolation region N-ISO formed over the whole surface of the substrate. Because the isolation STI is formed by forming a narrow groove by etching the silicon substrate and embedding an oxide film in the groove, crystal defects readily occur. Therefore, in a case where element isolation of the peripheral logic circuit is formed by means of an STI process, element isolation by STI is not adopted in the pixel portion, so that the leak current is reduced and the sensitivity is increased.

Thereafter, in step (A) of FIG. 9, a P-well region 'P-Well' of a predetermined depth is formed by implanting ions of boron B two times (B+, 300 k, 3E13, B+, 30 k, 0.5 to 1.5E13) into the N-channel transistor formation region of the logic circuit section. Further, an N-well region 'N-Well' of a predetermined depth is formed by performing phosphorous P ion implantation (P+, 600 k, 3E13) and arsenic As+ ion implantation (As+, 160 k, and 1 to 3E13) into the P-channel transistor formation region of the logic circuit section.

Thereafter, at the step (B) of FIG. 9, a silicon nitride film SiN (5 to 20 nm) is deposited over the whole of the substrate surface and this silicon nitride film SiN is removed by etching only in the pixel portion. Thereafter, in the pixel portion, a silicon oxide film ($SiO_2$) is formed on the silicon substrate surface by means of thermal oxidation. Here, the peripheral logic circuit section is not oxidized because it is covered by a nitride film SiN. The silicon oxide film $SiO_2$ in the pixel portion thus becomes the gate oxide film GOX of the detection transistor.

The well formation step of a pixel with a pitch size of 3.0 µm will be described below.

Figure 10:
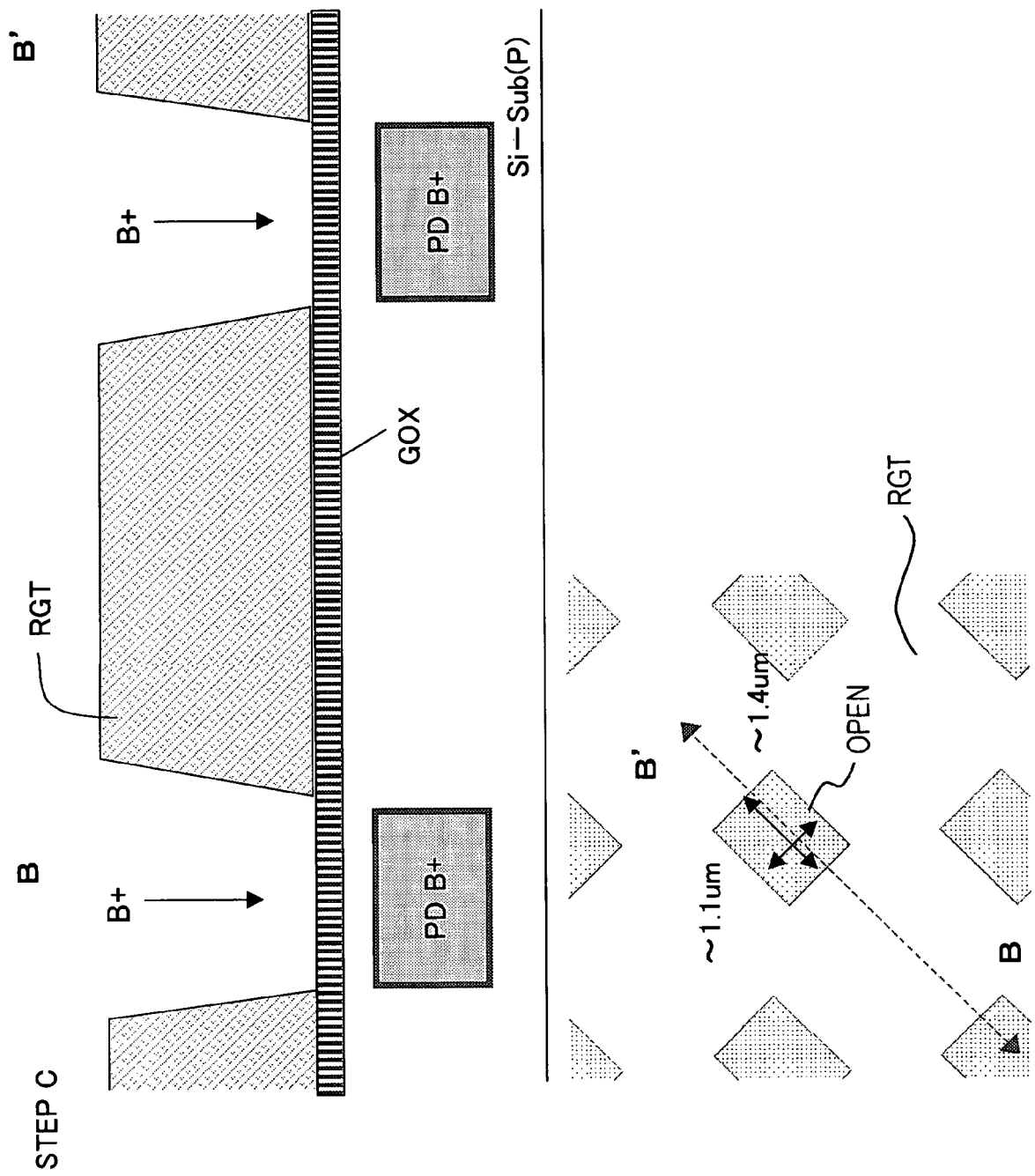
FIG. 10 shows the fabrication process of the image sensor of this embodiment.

In step (C) of FIG. 10, a resist RGT that is open in positions corresponding with the photoelectric conversion region PD of the pixel portion is formed and ion implantation of boron (B+, 400 k, 0.5 to 1.5E12, B+, 250 k, 0.5 to 1.5E12) is performed two times, whereby P-type implantation regions PD with implantation peak depths of up to 0.88 µm and up to 0.62 µm are formed. The region PD is the p-type photoelectric conversion region PD in FIGS. 5 to 7. In the planar view of FIG. 10, the rectangular form 1.1 µm×1.4 µm is an open portion of the resist RGT.

Figure 11:
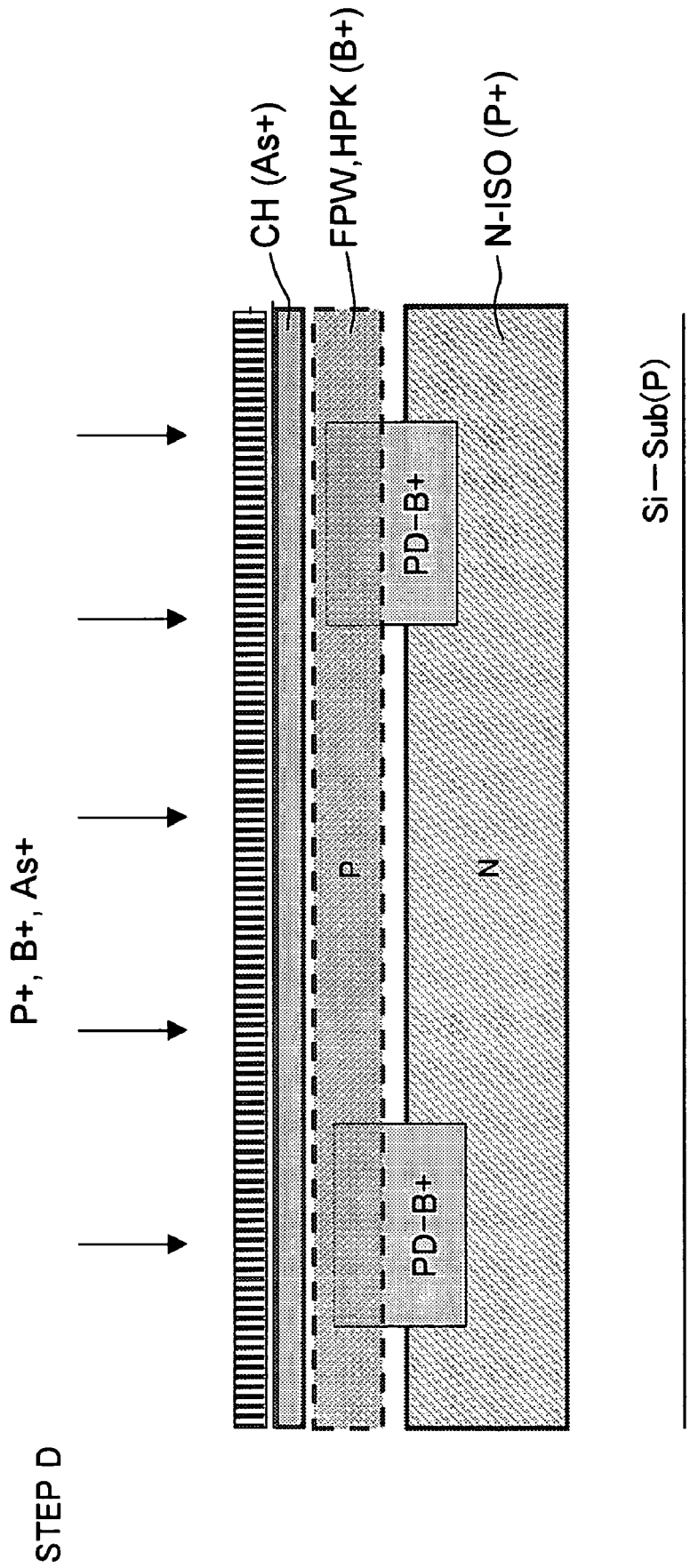
FIG. 11 shows the fabrication process of the image sensor of this embodiment.

Thereafter, in step (D) of FIG. 11, the whole of the pixel portion is exposed and the N-type isolation region N-ISO that is buried in the substrate, the P-type floating well region FPW, the P-type potential pocket region HPK, and an N-type impurity region CH for adjusting the threshold voltage of the detection transistor are formed by means of the following impurity ion implantation of phosphorous P, boron B, and arsenic As.

Figure 12:
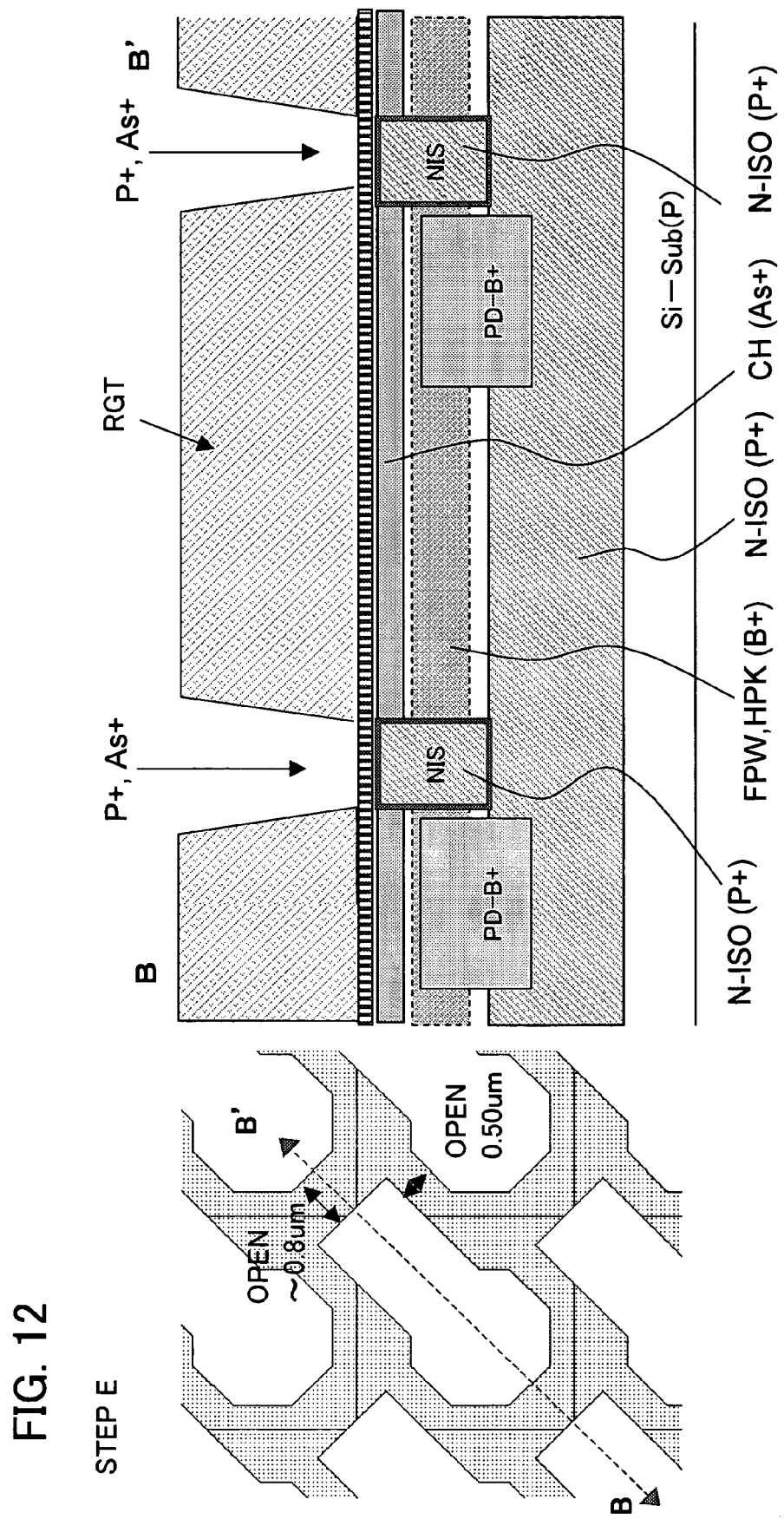
FIG. 12 shows the fabrication process of the image sensor of this embodiment.

(1) Buried N-type isolation region N-ISO
P+1200 k 0.5 to 1.5E12 implantation peak depth about 1.20 µm
P+900 k 0.5 to 1.5E12 implantation peak depth about 0.98 µm
P+550 k 1 to 2E12 implantation peak depth about 0.63 µm
(2) P-type floating well region FPW and P-type potential pocket region HPK B+ 130 k 0.5 to 1.5E12 implantation peak depth about 0.37 μm B+ 35 k 3 to 5E12 implantation peak depth about 0.10 μm (3) Threshold voltage adjustment N-type impurity region CH As+ 90 k 1 to 3E12 implantation peak depth about 0.03 μm In step (E) of FIG. 12, a resist RGT with an opening in a region other than the photodiode region and detection transistor region is formed, ion implantation with phosphorous P and arsenic As is performed as below, and an N-type isolation region N-ISO that extends from the substrate surface to a deep region in the substrate is formed. Accordingly, the N-type isolation region N-ISO that extends from the substrate surface is linked to the N-type isolation region N-ISO buried in the substrate and isolates the P-type well region FPW and photoelectric conversion region PD from the substrate and other pixels.

| | | | |
|---|---|---|---|
| P+ | 470 k | 2 to 5E12 | implantation peak depth about 0.55 μm |
| P+ | 270 k | 2 to 5E12 | implantation peak depth about 0.33 μm |
| P+ | 100 k | 1 to 5E12 | implantation peak depth about 0.13 μm |
| As+ | 80 k | 5E13 to 2E14 | implantation peak depth about 0.03 μm |

As a result of the above ion implantation, the regions FPW and HPK that were ion-implanted with boron B in step (D) of FIG. 11 are negated to become N-type regions.

Figure 13:
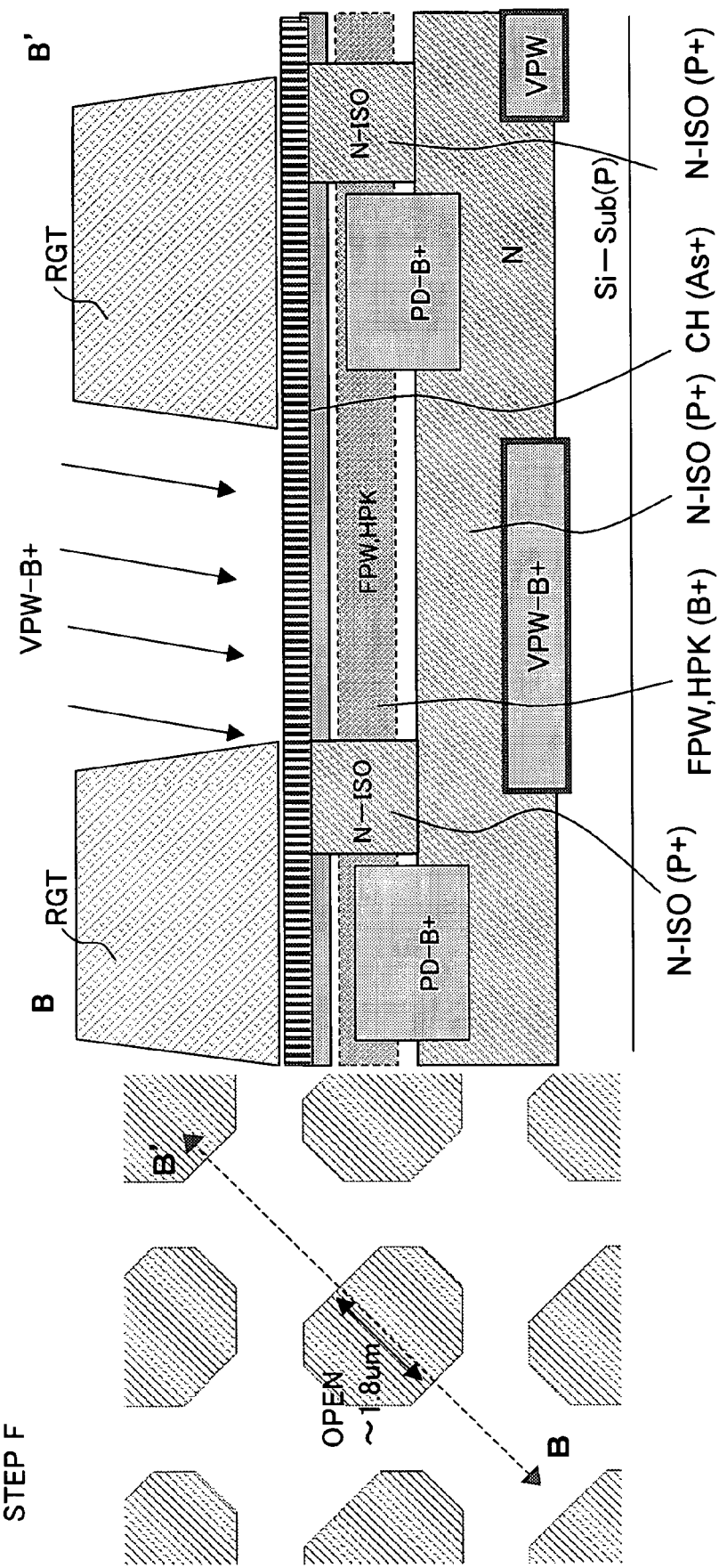
FIG. 13 shows the fabrication process of the image sensor of this embodiment.

Thereafter, in step (F) of FIG. 13, a resist RGT that opens slightly wider than the gate region of the detection transistor is now formed and a P-type impurity region VPW is formed deep the substrate. This formation is performed by means of the following ion implantation with boron B.

| | | | |
|---|---|---|---|
| B+ | 600 k | 2 to 4E12 | implantation peak depth about 1.15 μm |
| B+ | 500 k | 2 to 4E12 | implantation peak depth about 1.0 μm |

As a result of this ion implantation, the thickness of the N-type isolation region N-ISO buried immediately below the gate electrode is reduced. That is, an N-type buried isolation region with a profile with a narrow width and a steep impurity concentration profile is formed between the floating well region FPW in which the potential pocket region HPK is formed and the substrate Sub. This step (F) completes the well region formation step that is executed by means of pixel-portion ion implantation.

In addition, in the ion implantation, by setting the tilt angle of the ion implantation device at a slight incline (8°, for example) as shown in the cross-sectional view in FIG. 13, the ions of boron B are implanted in a region that links the P-type well region FPW and photoelectric conversion region PD. That is, in cases where the inclination exists at the open portion of the resist RGT, the occurrence of so-called 'peaking' in which impurities are implanted into a shallow region in the substrate in accordance with the resist inclination part is known. As a result of the occurrence of peaking, when boron B, which is a P-type impurity, is implanted into a hole propagation path between the pocket region HPK in the P-type well region and the photoelectric conversion region PD, another shallow potential pocket region is formed in the hole propagation path. The existence of this pocket region leads to the accumulation of holes during propagation and a reduction in the amount of holes accumulated in the potential pocket region HPK, which is required for light amount detection, so the sensitivity is dropped. Therefore, in step (F), the shallow P-type region caused by peaking is not formed on the side of the photoelectric conversion region PD by tilting the ion implantation angle.

Figure 14:
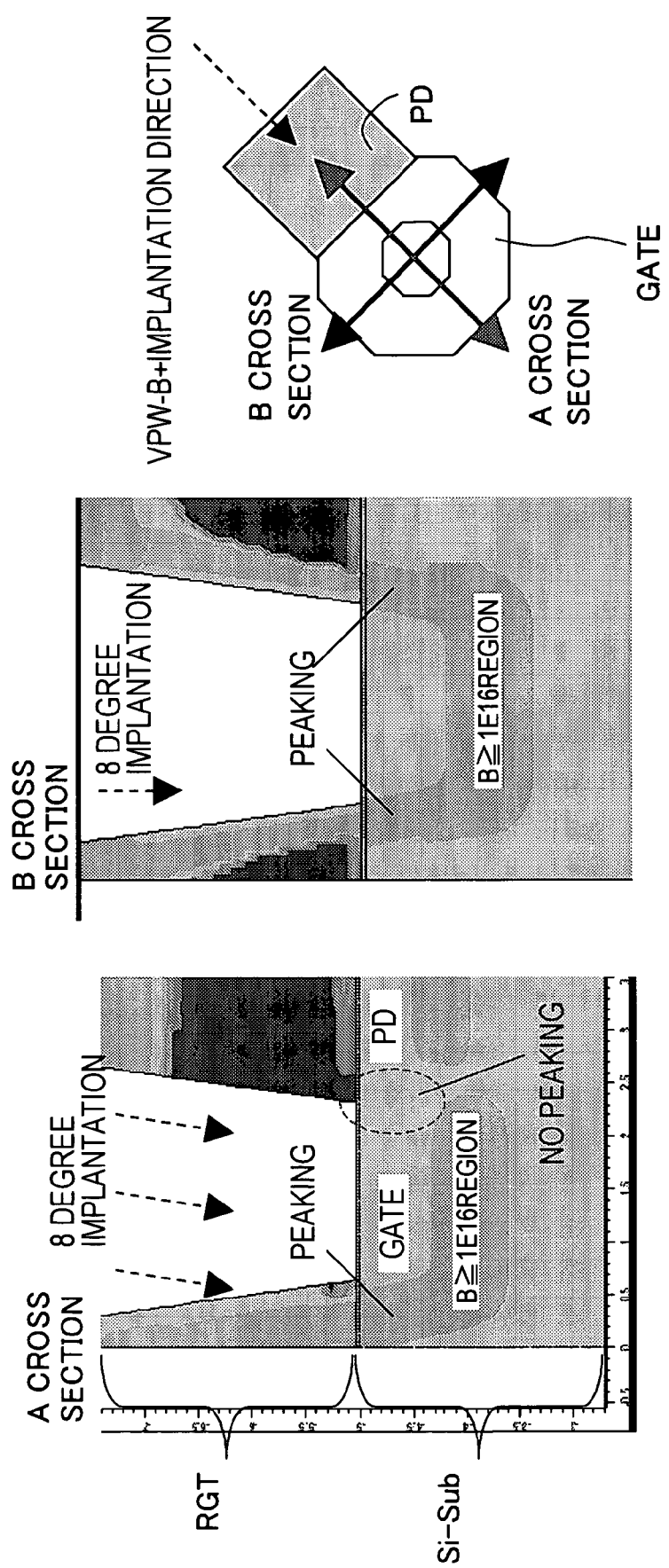
FIG. 14 shows the fabrication process of the image sensor of this embodiment.

FIG. 14 illustrates the peaking phenomenon of step (F) Boron ions are implanted in the direction indicated by the broken-line arrow in the planar view of FIG. 14 and the P-type impurity region VPW is thus formed. The peaking phenomenon in the A cross section and B cross section at this time is shown. In the A cross section, although the impurity region caused by peaking is not formed between the photoelectric conversion region PD and gate portion as a result of the 8° tilt angle, on the opposite side, an impurity region caused by peaking is formed from the substrate surface to a deep region. On the other hand, in the B cross section, because the implantation direction is the direction of the inclination with respect to the surface of the paper, a peaking impurity region is formed from the substrate surface to a deep region on both sides of the resist open portion.

Figure 15:
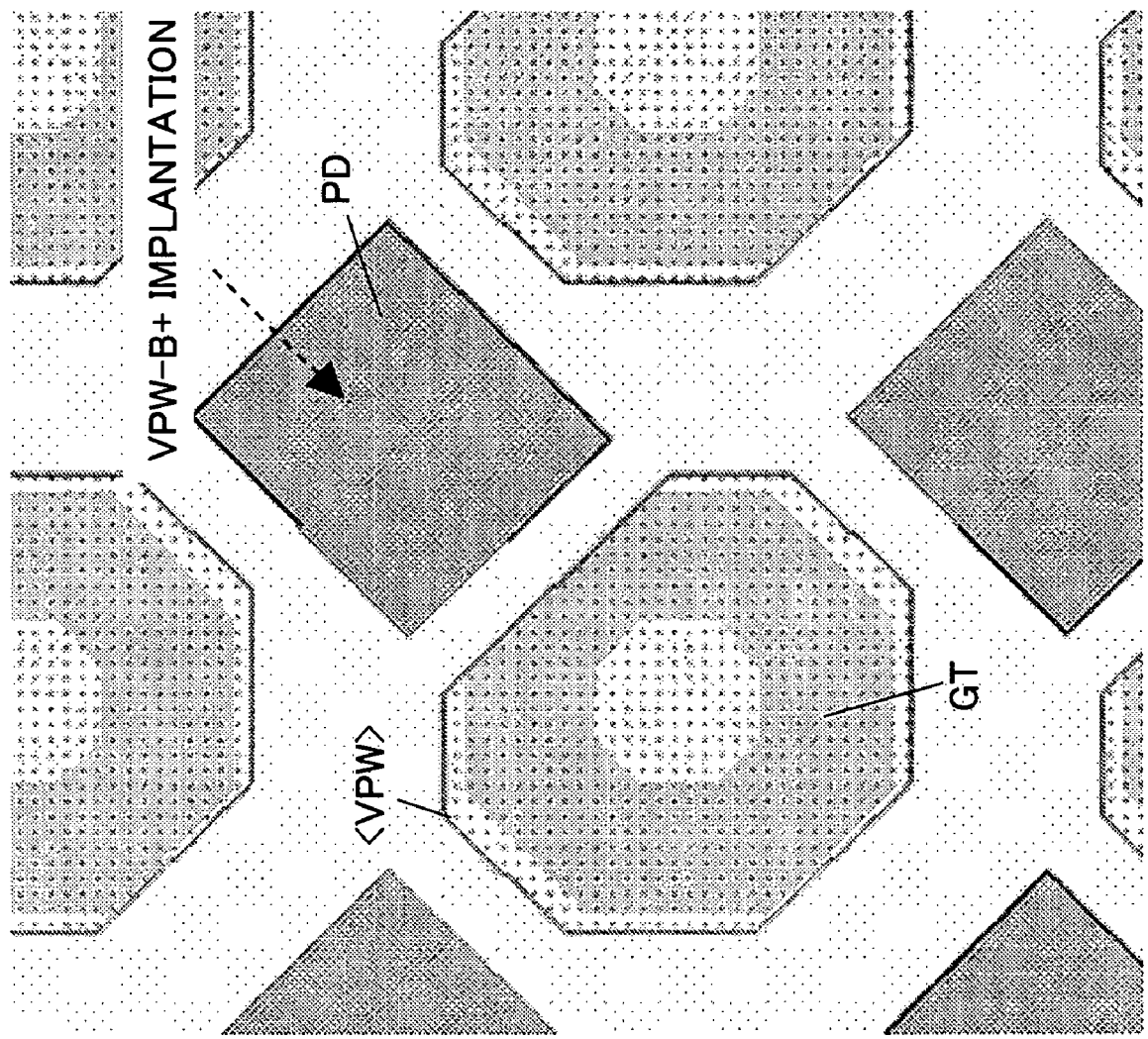
FIG. 15 shows the fabrication process of the image sensor of this embodiment.

FIG. 15 is a planar view showing the open region <VPW> of the resist that is formed by step (F). The impurity region VPW caused by the occurrence of peaking is also formed in a deep region of the substrate excluding the region linked to the photoelectric conversion region PD. It is therefore a requirement that the potential pocket region HPK that is to be formed directly below the gate GT should not be influenced by the shallow impurity region VPW. For this reason, the shape of the resist open region <VPW> must be made wider than the region of the gate GT excluding the region linked to the photoelectric conversion region PD. In order to avoid forming the shallow impurity region VPW in the region linking the potential pocket region HPK below the gate GT and the photoelectric conversion region PD, boron ion injection is performed with a tilt angle. However, a shallow impurity region caused by peaking is formed outside the above linked regions. Therefore, as a result of forming the above resist open region, the shallow impurity region caused by peaking due to the ion implantation is not formed directly below the gate GT. That is, the resist open region <VPW> has a wide shape that includes the gate GT excluding the region linked to PD.

In step (G) of FIG. 16, the silicon nitride film covering the logic circuit section is removed and a thin gate oxide film GOX2 with about 8 nm is formed on the logic circuit section by means of thermal oxidation. Meanwhile, a gate oxide film GOX1 to which the thermal oxide film of step (G) has been added is formed on the pixel portion in addition to the thermal oxide film (about 30 nm) already formed. Further, in the logic circuit section, the gate oxide film GOX2 at a partial-region may be removed, thermally oxidized once again, and a thinner gate oxide film (about 3 nm) may be formed.

Figure 17:
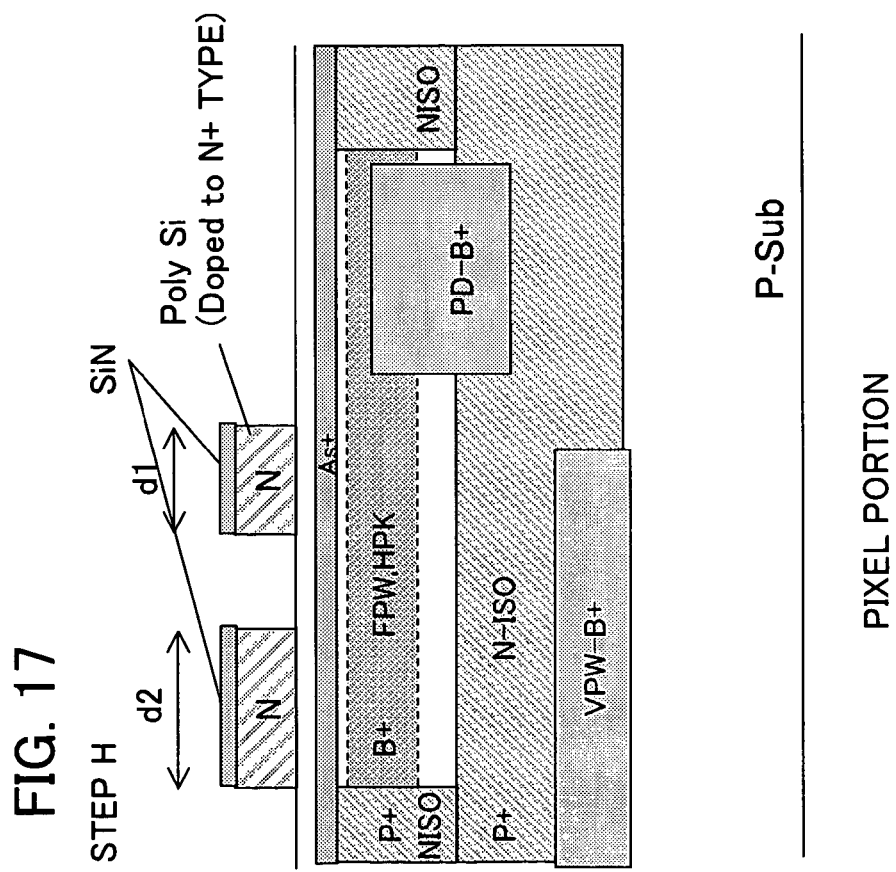
FIG. 17 shows the fabrication process of the image sensor of this embodiment.

In step (H) of FIG. 17, a gate electrode is formed on both the pixel portion and logic circuit section. A polysilicon layer (about 180 nm), which constitutes the material of the gate electrode, is deposited, and ion implantation with phosphorous ions P+ at 20 k, 4E15 to 6E15 is performed on only the pixel portion and the N-channel transistor portion of the peripheral logic circuit section. Annealing for about 60 minutes at 800° C. is then performed. As a result, a polysilicon gate that is doped to render an N-type gate is formed on the pixel portion and the N-channel transistor portion of the logic circuit section. The non-doped polysilicon gate still remains on the P-channel transistor portion of the logic circuit section at this point.

Thereafter, a silicon nitride film SiN of about 30 nm is deposited as a anti-reflection coating film, a resist with a gate electrode pattern is formed, and stacked films of the polysilicon layer and silicon nitride film layer are etched by means of a chlorine-based etching gas to render the gate electrode shape. The gate-electrode patterning step is performed at the same time in the pixel portion and peripheral logic circuit section. Here, the gate electrode pattern is formed in the pixel portion with a narrow gate width d1 on the side of the photodiode PD and with a wide gate width d2 elsewhere as illustrated by FIG. 5.

Further, although not illustrated, N-type low-density source, drain region LDD of an N-channel-side, and P-type low-density source, drain region LDD of a P-channel-side are each formed in the logic section with the gate electrode serving as a mask.

Figure 18:
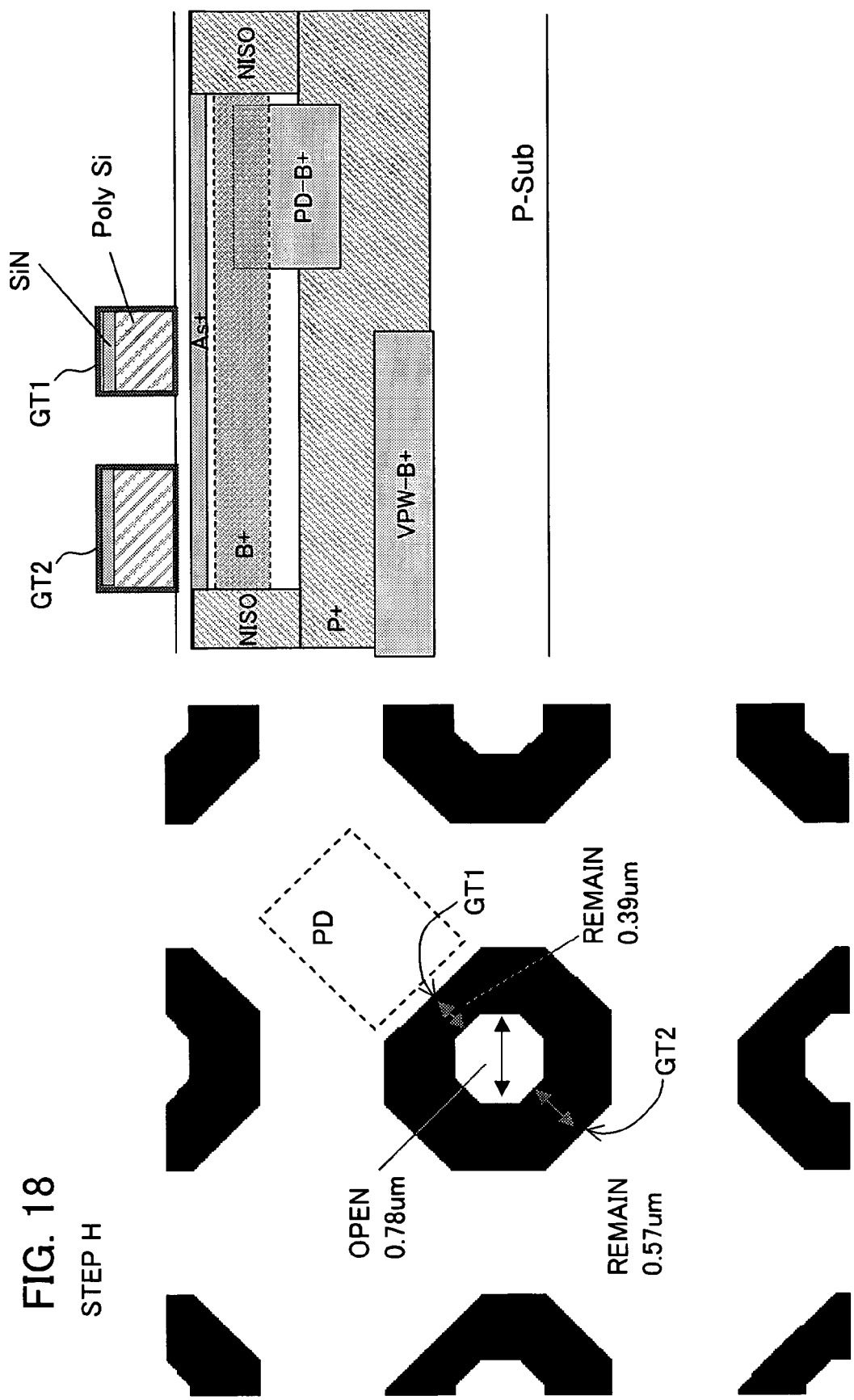
FIG. 18 shows the fabrication process of the image sensor of this embodiment.

FIG. 18 shows the gate electrode patterning step in step (H) The formation of the gate electrode is shown in the planar view on the left-hand side of FIG. 18, and the cross-sectional view on the left-hand side is the same as that of the pixel portion in FIG. 17. As shown in the planar view, the gate electrode GT is constituted such that the gate width (GT1) on the side of the photodiode PD is narrower than the gate width (GT2) of the remaining region. As a result, the potential level of the potential pocket region HPK that is formed below the gate electrode can be made substantially uniform. More specifically, asymmetric gate electrodes are formed as a result of the gate GT1 being formed on the order of 0.39 μm and the remaining gate GT2 being formed on the order of 0.57 μm.

Figure 19:
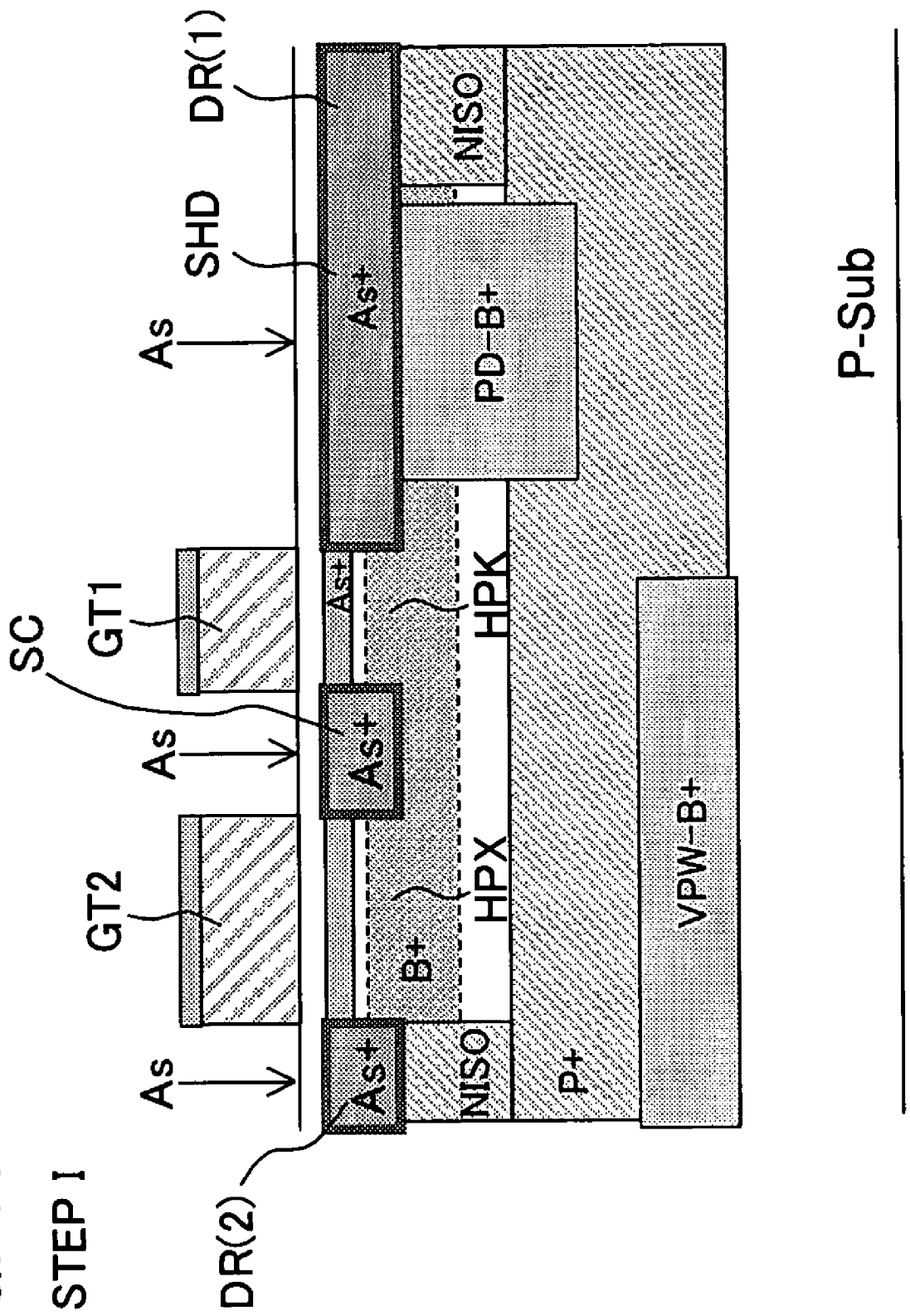
FIG. 19 shows the fabrication process of the image sensor of this embodiment.

In step (I) of FIG. 19, an N-type shield region, drain region DR, and source region SC are formed in the substrate surface excluding the gate electrode GT1, GT2 as a result of forming a resist that is open over the whole surface of the pixel portion and implanting arsenic ions As+ to an implantation depth of about 0.01 μm at 50 k, 2E13 to 1E14 with the gate electrodes GT1 and GT2 serving as the mask. As a result of the implantation of arsenic ions, the P-type region in the substrate surface is negated and, as a result of self-alignment of the gate electrode, the potential pocket region HPK is formed directly below the gate electrode on the substrate surface. At such time, the polysilicon layer of the gate electrode is comparatively thin. However, because the anti-reflection coating film of the silicon nitride is stacked, the arsenic ions do not penetrate the gate electrode and do not affect the channel region.

Therefore, because the shape of the potential pocket region HPK is defined by the asymmetric gate electrodes GT1 and GT2, the shape of the potential pocket region HPK is formed narrowly on the side of the photodiode PD and widely in the remaining region. As a result, the potential level of the ring-like potential pocket region HPK can be made substantially uniform.

Figure 20:
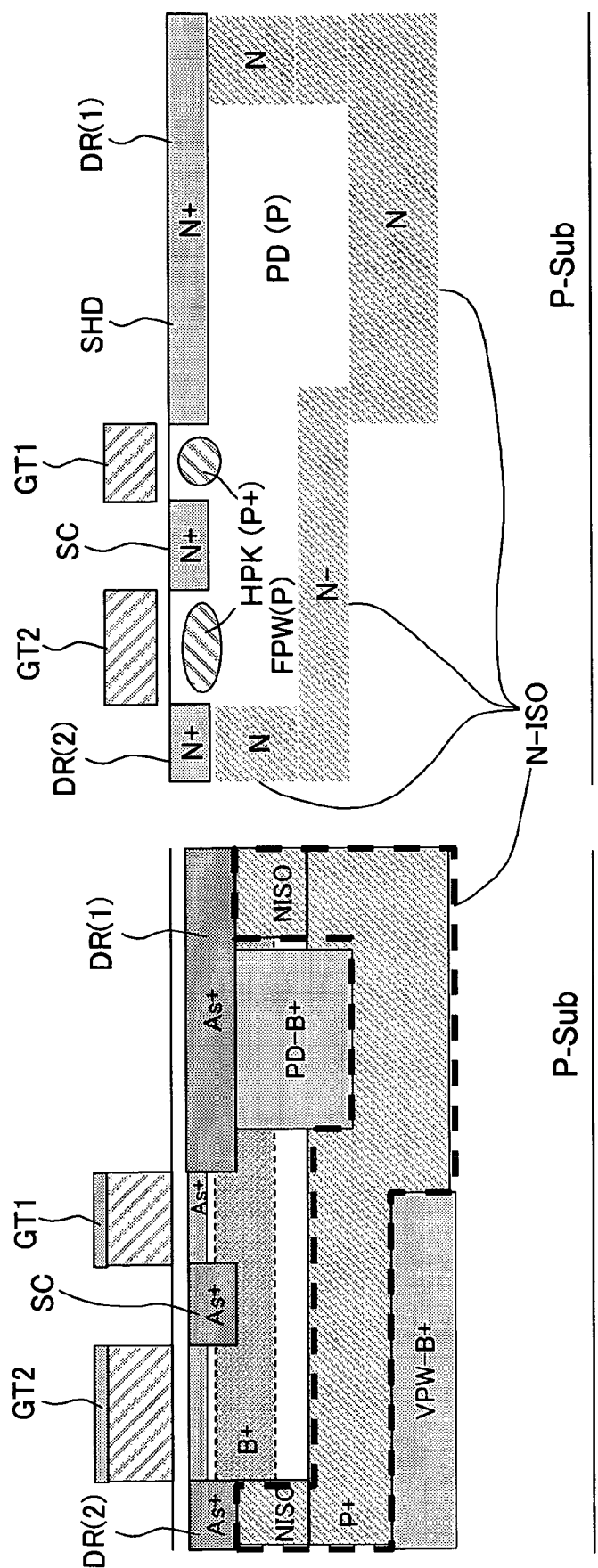
FIG. 20 shows the relationship between the ion injection region of the first embodiment and the structure of the pixel portion.

FIG. 20 shows the relationship between the ion implantation region and the structure of the pixel portion. The left-hand side of FIG. 20 is a cross-sectional view of the ion implantation region and implanted ions, while the right-hand side of FIG. 20 is a cross-sectional view of the P- and N-type regions that is the same as the cross-sectional view of FIG. 5. It can be seen that the region surrounded by a thick broken line in the ion implantation region on the left-hand side corresponds with the N-type isolation region N-ISO. That is, the N-type isolation region surrounds a pixel region that includes the P-type well region FPW and the photoelectric conversion region PD. The N-type isolation region is formed in shallow and narrow directly below the potential pocket region HPK where the detection transistor is formed and in deep and thick in the photoelectric conversion region PD where the photodiode is formed. In addition, the potential pocket region HPK is formed across the whole region below the gate electrodes GT1 and GT2 and the ring shape of the potential pocket region HPK is formed asymmetric.

Figure 21:
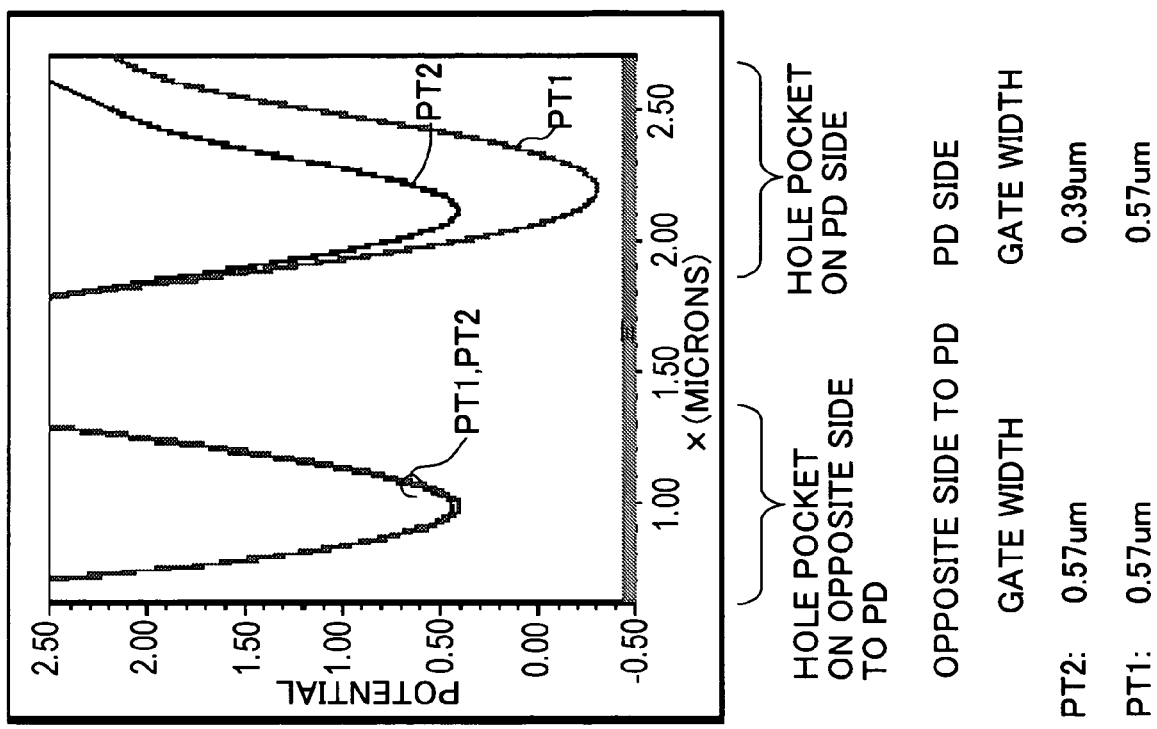
FIG. 21 shows the potential of the potential pocket region of the image sensor.

FIG. 21 shows the potential of the potential pocket region of an image sensor that is formed by means of the above process. The physical space in the direction of the broken arrow in FIG. 5 is plotted on the horizontal axis, while the height of the potential relative to holes is plotted on the vertical axis. These are simulation results that were found in correspondence with the process above and the gate widths illustrated below. The potential curve PT1 represents a case where the gate widths are uniform, while the potential curve PT2 represents a case where the gate widths are nonuniform as aforementioned. In the case of the potential curve PT2, the gate width on the photodiode side is 0.39 μm, while the gate width of the remaining region is 0.57 μm. As a result, the depth of the potential of the potential pocket region HPK at two points is substantially uniform. On the other hand, in the case of the potential curve PT1, the gate width on the photodiode side is 0.57 μm and the gate width of the remaining region is also 0.57 μm. As a result, the depths of the potential of the potential pocket region HPK at two points are such that the potential depth on the photodiode side is approximately 0.7 V lower.

Figure 22:
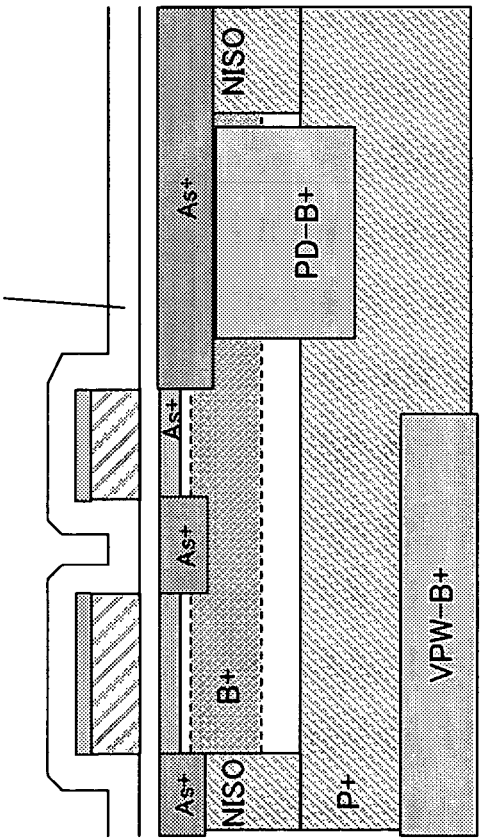
FIG. 22 shows the fabrication process of the image sensor of this embodiment.

In step (J) of FIG. 22, a silicon oxide film 30 is deposited by CVD on the substrate surface about 100 nm and the whole pixel portion is covered by a resist layer, whereupon side walls SWALL are formed on the gate electrode side walls by subjecting the silicon oxide film of the logic circuit section to anisotropic etching. Thereafter, in the peripheral logic circuit section, the N-channel transistor portion is subjected to the injection of phosphorous ions P+, 15 k, about 2E15 and the P-channel transistor portion is subjected to the ion implantation of boron ions B+, 7 k, and 2E15, whereupon activation annealing RTA (1000° C., 10 s) is performed to form the source-drain regions NSD and PSD. At such time, the gate of the P-channel transistor is doped to be P-type at the same time as the source-drain regions PSD are implanted with ions and the source-drain regions are formed by means of activation annealing.

Thereafter, as a result of sputtering with cobalt Co or titanium Ti and annealing, a CoSi or TiSi metal silicide MSSD is formed on the silicon substrate surface of the logic circuit section and the gate electrode. Because the surface of the pixel portion is covered by a silicon oxide film 30, a silicide is not formed by the sputtering.

Figure 23:
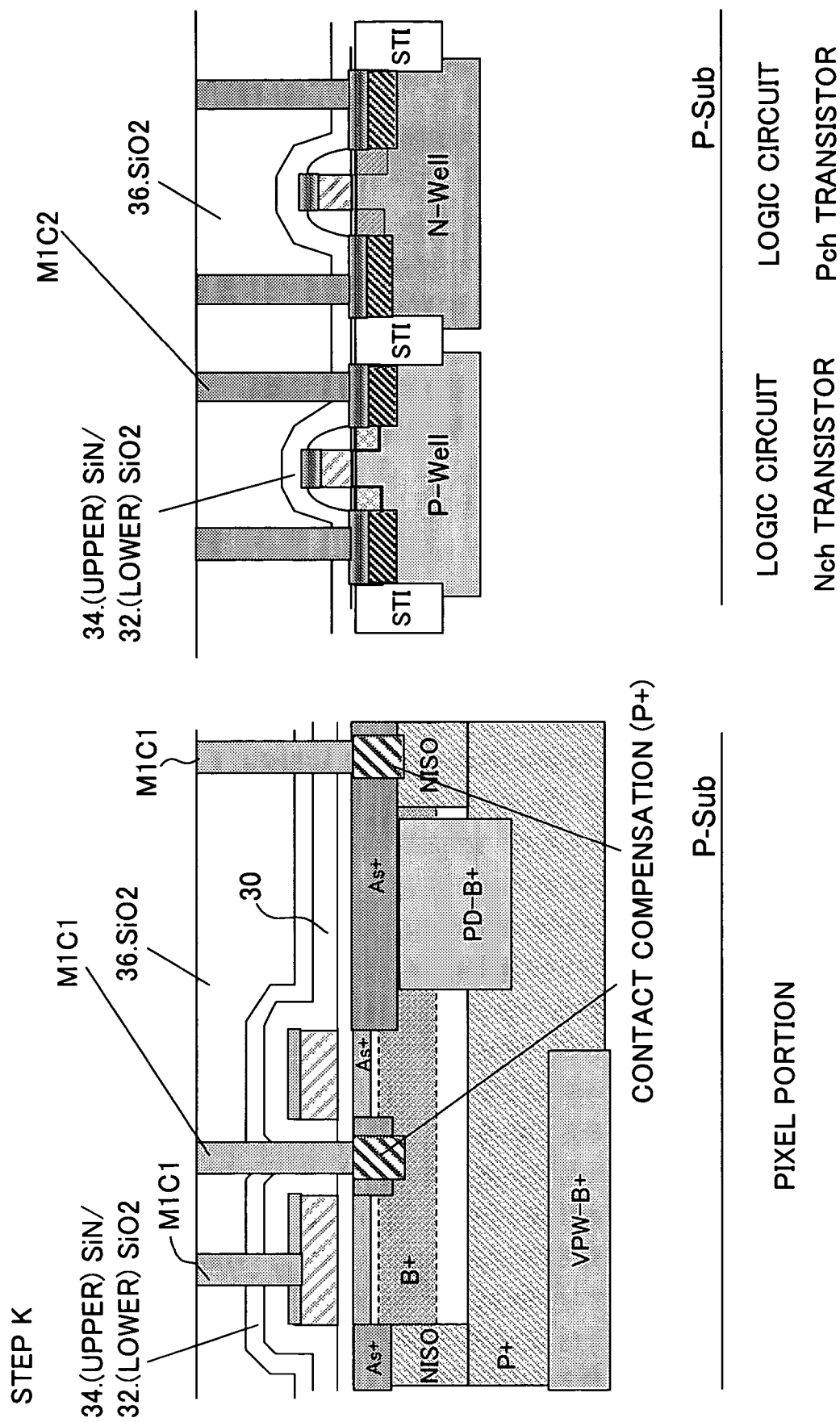
FIG. 23 shows the fabrication process of the image sensor of this embodiment.

In step (K) of FIG. 23, following the metal silicide formation, stacked films consisting of a silicon oxide film (lower layer) 32 formed by plasma CVD that is about 20 nm and a silicon nitride film (upper layer) 34 that is about 70 nm thick are deposited. Thereafter, a silicon oxide film 36 is deposited about 100 nm by means of plasma CVD. The silicon oxide film 36 is then polished and leveled by means of Chemical Mechanical Polishing (CMP). Further, a resist pattern that is open only above the source, drain and gate of the pixel portion is formed and a contact hole M1C1 that reaches the silicon substrate surface is formed by etching the stacked films 30, 32, 34, 36 of the SiO2 film/SiN film/SiO2 film. In addition, after the resist has been removed, contact compensation ion implantation with phosphorous ions P+ at about 50 k, 3E14 is performed and rapid thermal annealing (800° C., about 30 s) is executed as activation annealing. Thereafter, a resist that is open at the contact portion of the logic section is formed, the stacked films 32, 34, and 36 of the SiO2 film/SiN film/SiO2 film are etched, and a contact hole M1C2 that reaches the top of the metal silicide layer CoSi is formed.

Figure 24:
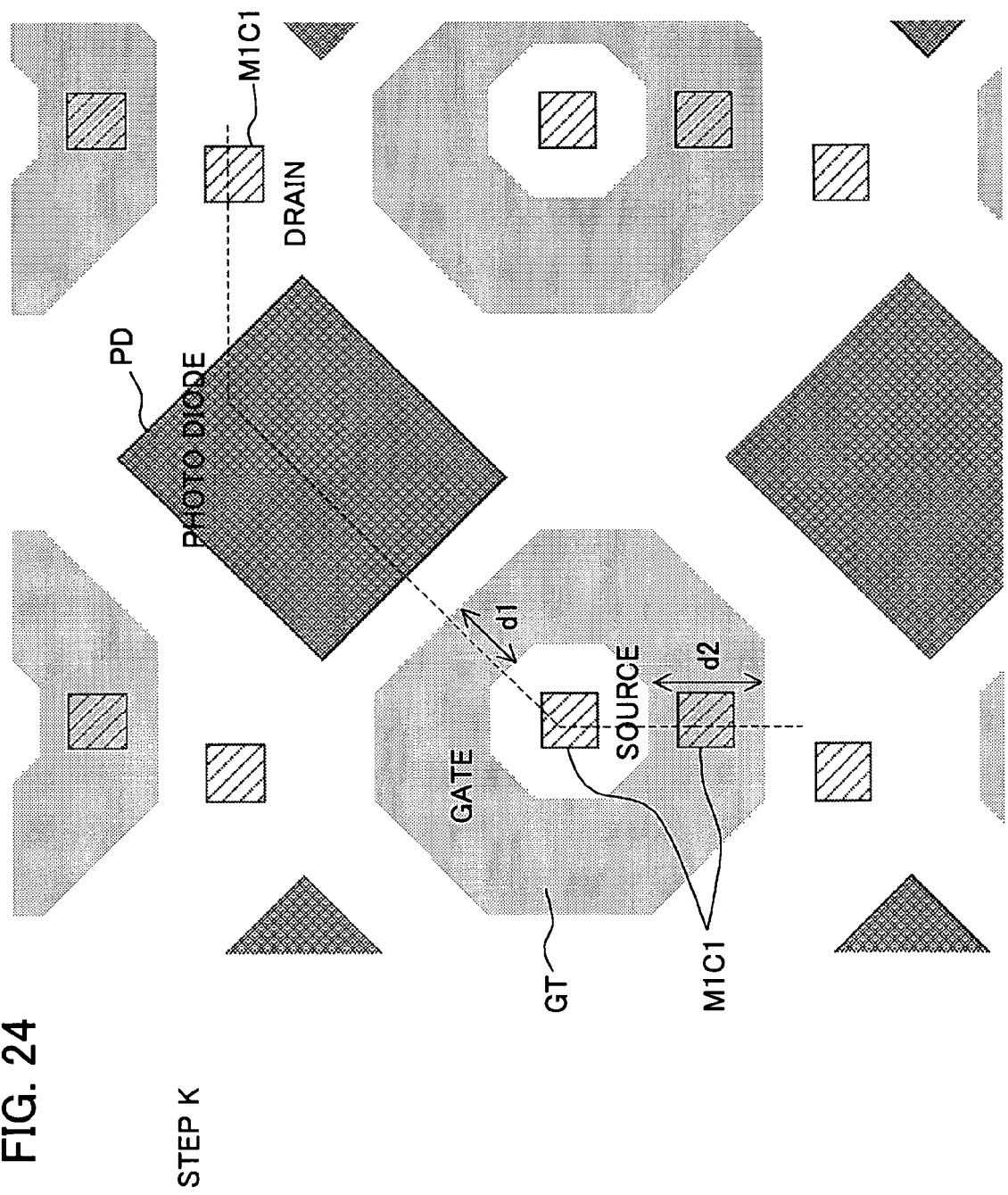
FIG. 24 shows the fabrication process of the image sensor of this embodiment.

FIG. 24 is a planar view at the time step (K) of the pixel portion is completed. The cross-sectional view along the broken line in FIG. 24 corresponds with the cross-sectional view of the pixel portion in FIG. 23. As can be seen when FIG. 24 is viewed in combination with the cross-sectional view, the gate widths d1 and d2 are formed such that the gate width d1 of the region linked to the photodiode PD is narrower than the gate width d2 of the other region. Further, the contact holes M1C1 for the gate, source and drain are formed in the positions illustrated. The contact hole M1C1 of the gate GT is formed in the section with the wide gate width d2.

Figure 25:
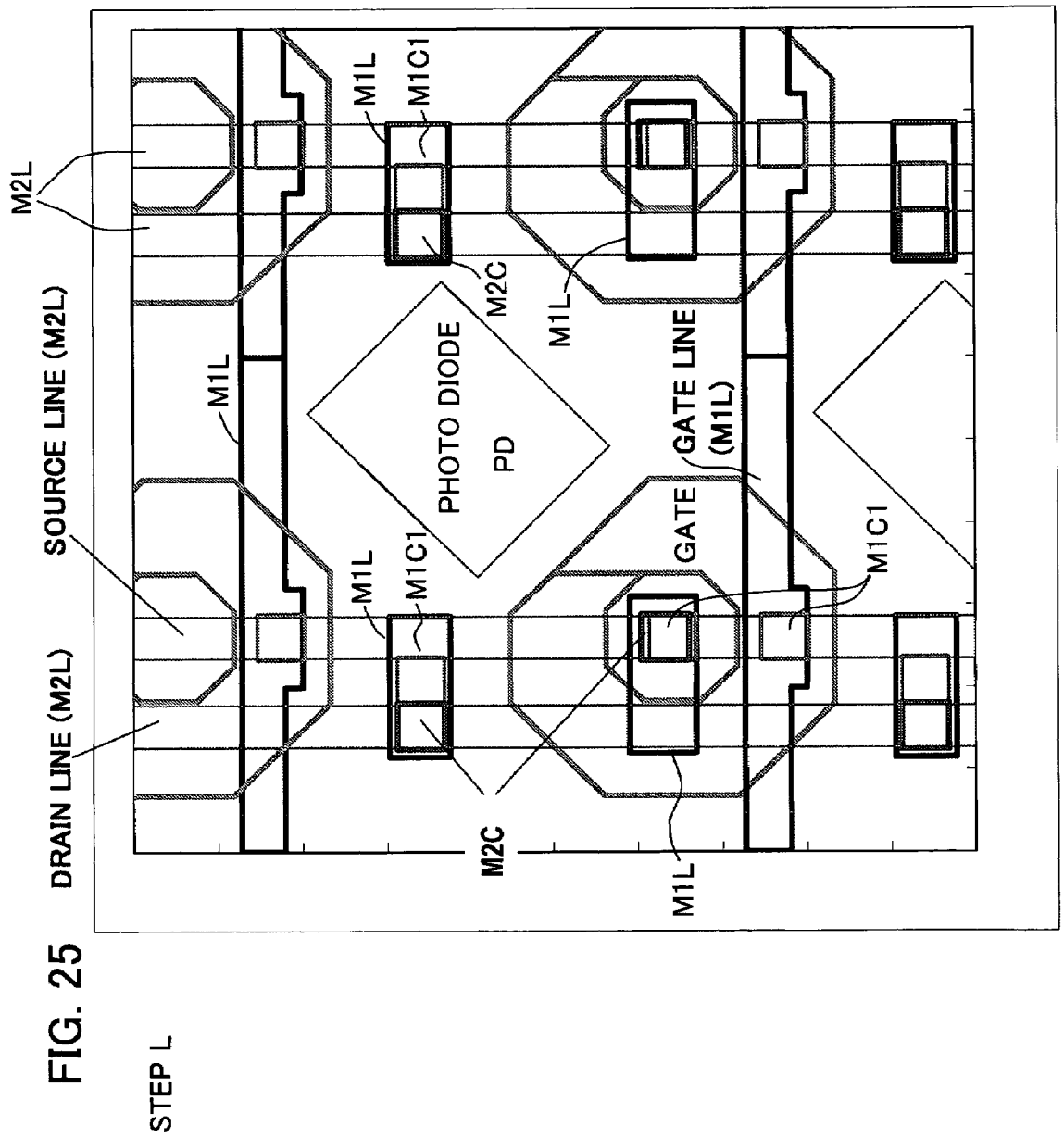
FIG. 25 shows the fabrication process of the image sensor of this embodiment.

FIG. 25 is a planar view of step (L). After the contact holes M1C1 have been formed in step (K) of FIG. 24, the following wiring formation step is executed. First, tungsten plug formation in the contact hole M1C1 is performed and first metal wiring M1L is formed above this wiring. The first metal wiring M1L is patterned as a gate line extending in the row direction and as a contact pattern that is connected to the contact hole M1C1 of the source and drain regions. In addition, via contacts M2C for the source and drain regions are formed and second metal wiring M2L is formed above the via contacts M2C, which is then patterned as drain and source lines that extend in the column direction. That is, the gate line formed by means of the first metal wiring M1L is connected to the gate electrode via the contact hole M1C1. The source and drain lines that are formed by means of the second metal wiring M2L are connected to the source and drain regions respectively via the via contact M2C, the first metal wiring M1L, and the contact hole M1C1.

Fabrication steps for the image sensor comprising a peripheral logic circuit of the first embodiment were described above. In the case of the second embodiment, the similar fabrication steps are performed such that the gate width is uniform and the concentration of the potential pocket region HPK in the region linked to the photodiode is lower than that of the remaining region. Further, in the case of the third embodiment, the similar fabrication steps are performed such that the gate width and the concentration of the potential pocket region HPK are uniform and, in regions other than the region linked to the photodiode, the N-type isolation region N-ISO extending in the depth direction from the substrate surface may be formed spaced apart from the gate electrode.

Operating Principles

Figure 26:
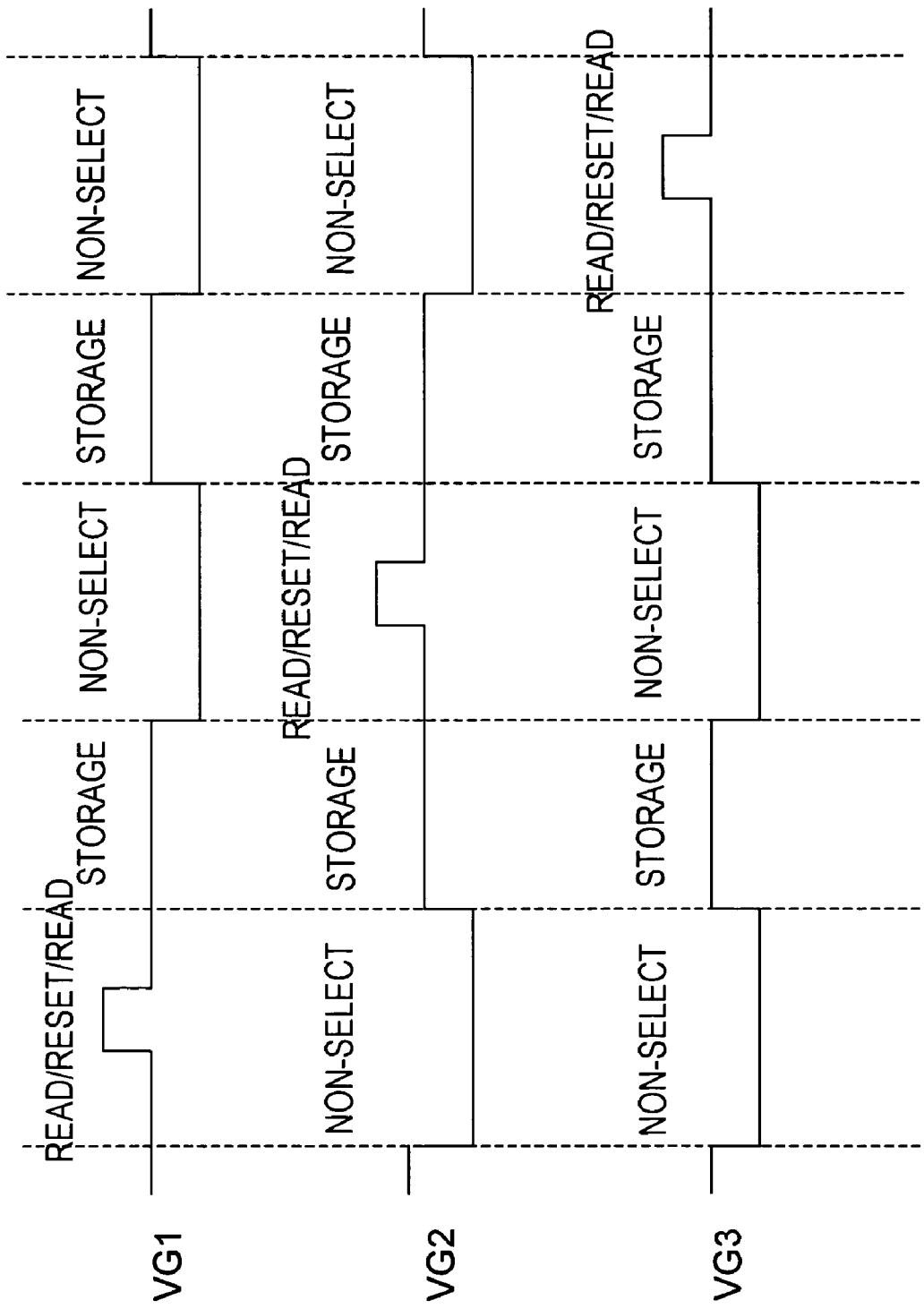
FIG. 26 shows the driving method of the Vth modulation image sensor (VMIS) of this embodiment.
Figure 27:
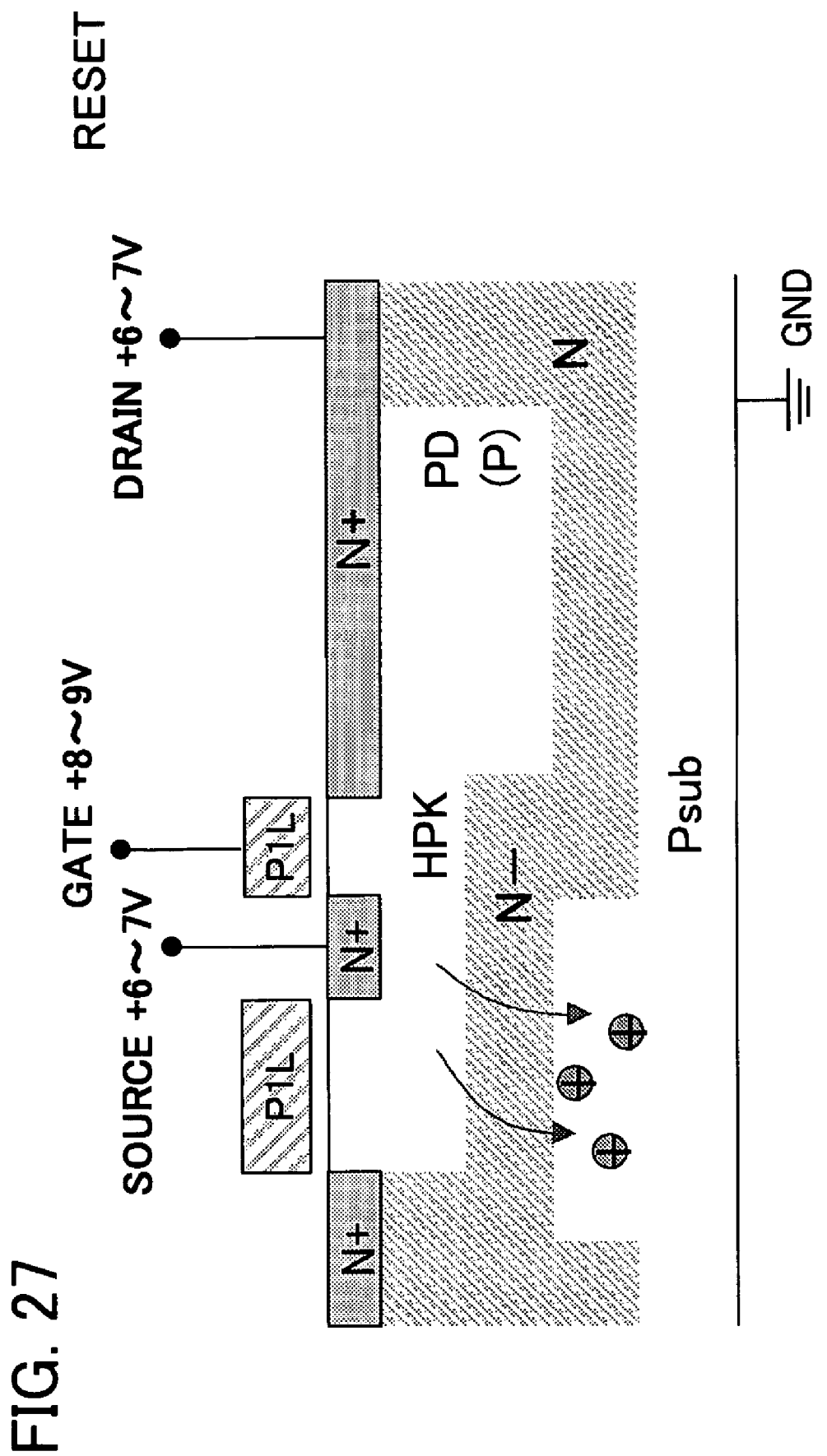
FIG. 27 shows a reset operation.
Figure 28:
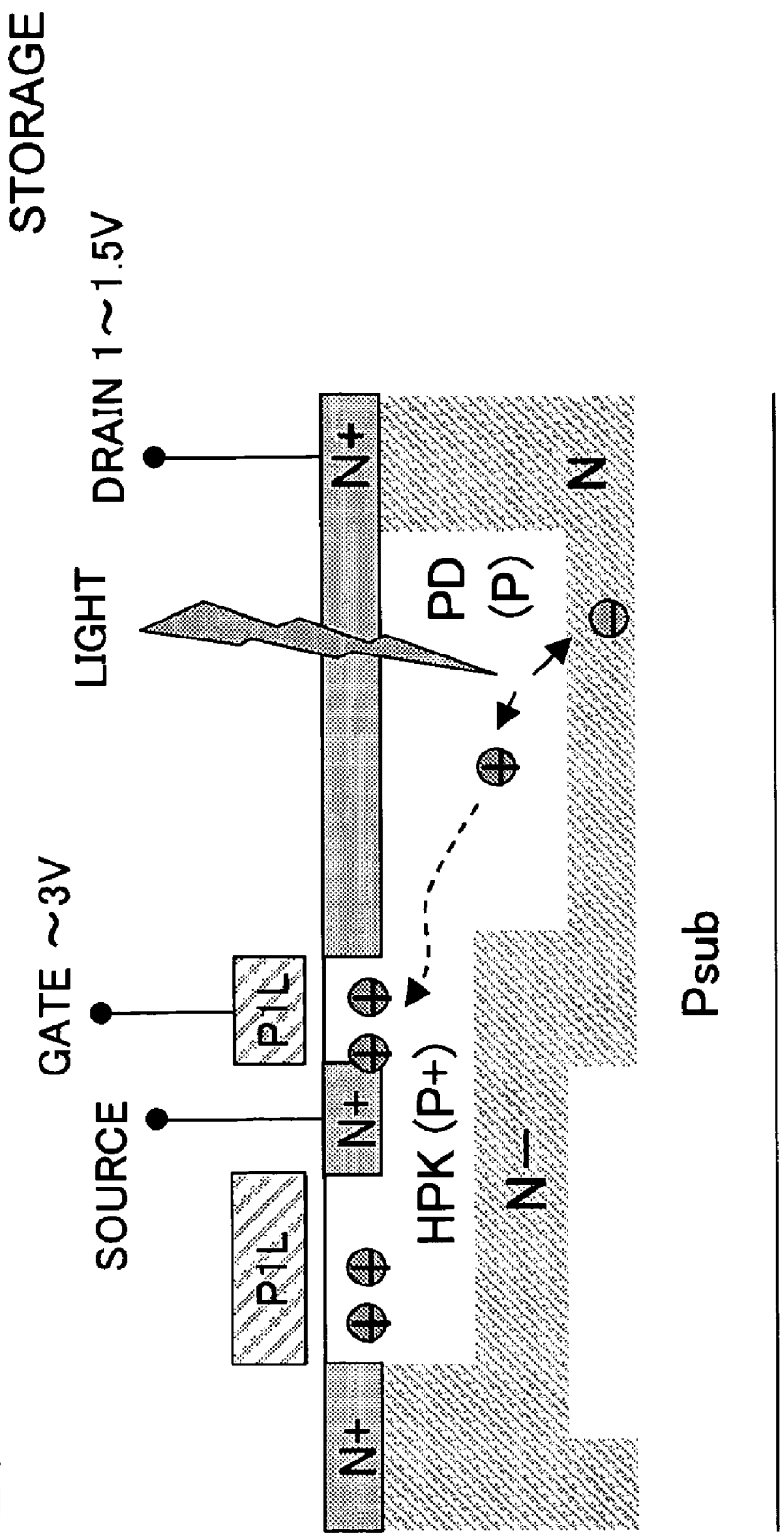
FIG. 28 shows a storage operation.
Figure 29:
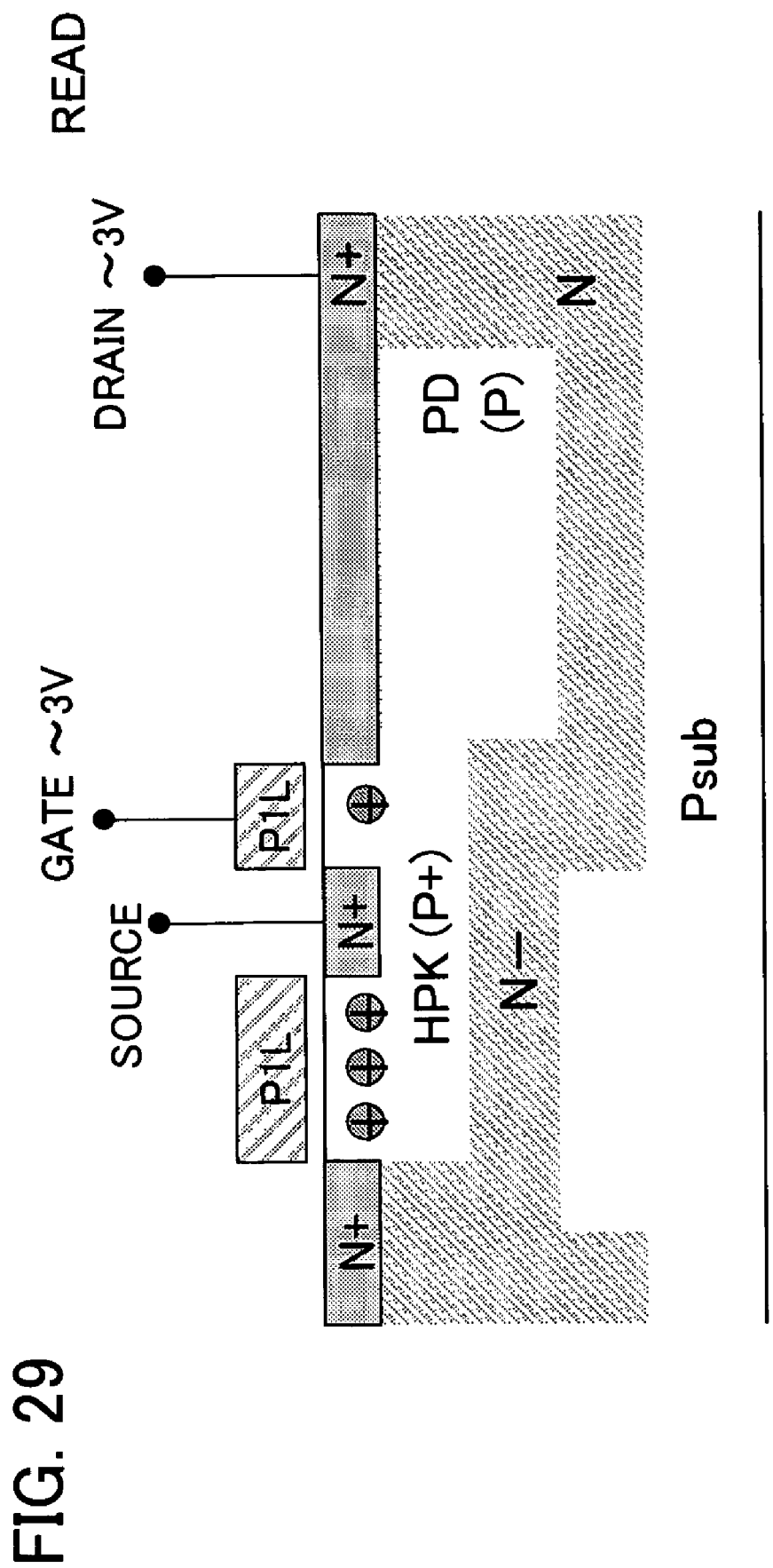
FIG. 29 shows a read operation.
Figure 30:
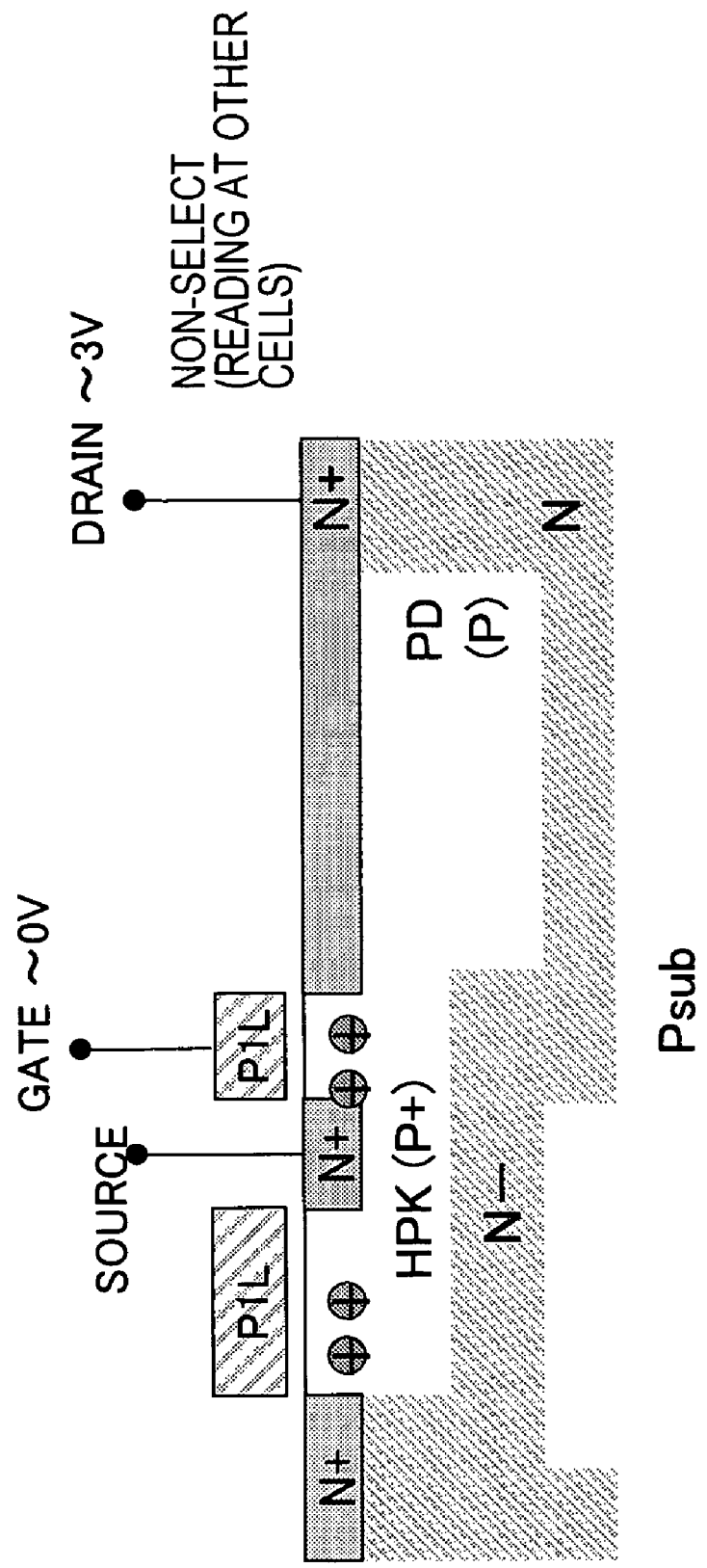
FIG. 30 shows a deselect operation.
Figure 31:
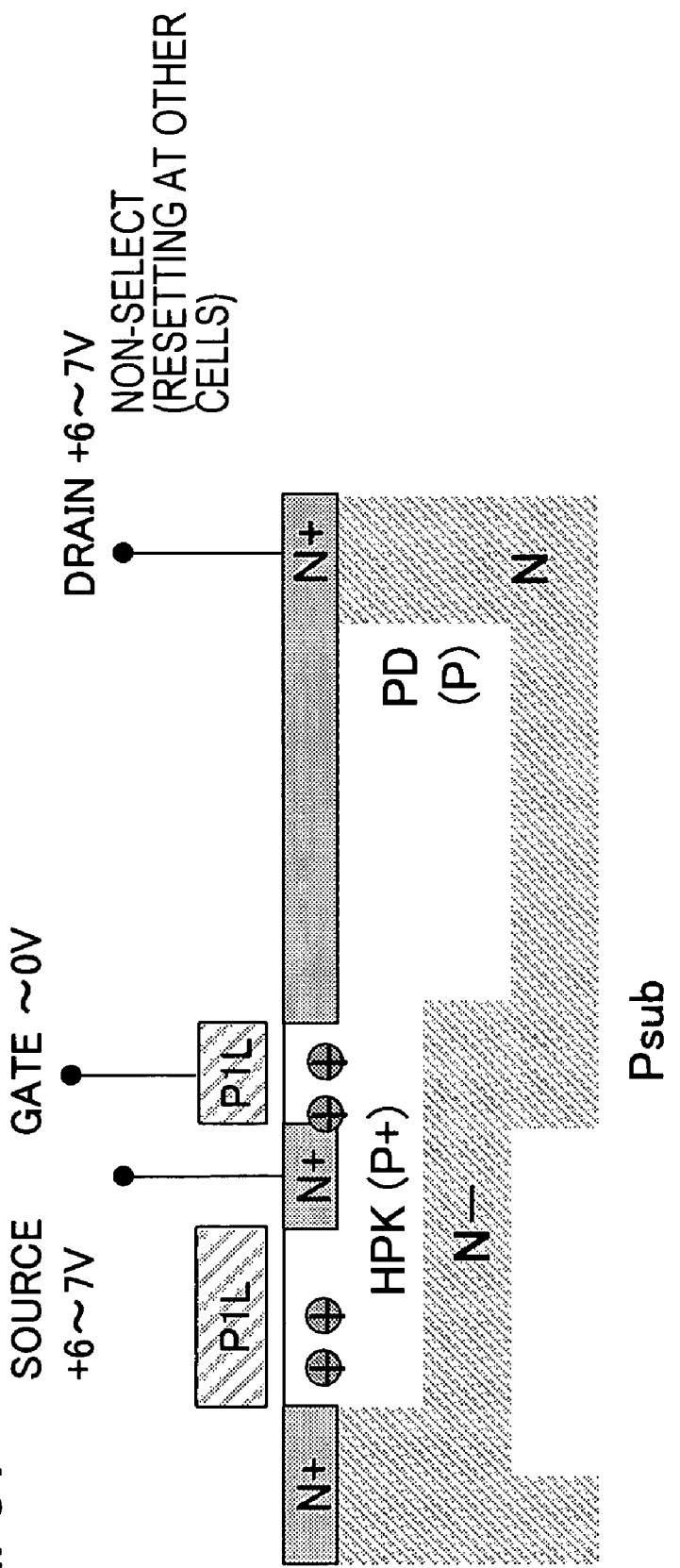
FIG. 31 shows the deselect operation.

FIG. 26 shows the driving method of the Vth modulation image sensor (VMIS) of this embodiment. In FIG. 26, the voltages VG1 to VG3 of three gate lines are shown. Further, FIG. 27 shows the reset operation, FIG. 28 shows the storage operation, FIG. 29 shows the reading operation, and FIGS. 30 and 31 show a non-select operation. First, describing the overall operation, the P-type potential pocket region HPK and P-type floating well region FPW are initially completely depleted by means of the reset operation shown in FIG. 27 and accumulated electrical charge (holes) is released to the substrate side Psub. The released electrical charge is absorbed by the ground power supply that is connected to the substrate. Here, the P well region is completely depleted by applying high positive voltages as follows: 8 to 9 V to the gate, 6 to 7 V to the source, and 6 to 7 V to the drain. Thermal noise can be removed by this complete depletion.

Thereafter, according to the storage operation shown in FIG. 28, the holes produced in the photoelectric conversion region PD in response to the received light are accumulated in the potential pocket region HPK. At such time, about 3V is applied to the gate, and 1 to 1.5 V is applied to the drain. As a result of this hole accumulation, the threshold voltage of the detection transistor changes (drops). Accordingly, a voltage that drops from the gate voltage by the threshold voltage of the detection transistor is generated at the source at signal read operation. Further, the detection transistor is held in the ON state so that an N-type channel region is formed in the substrate surface, and thereby the effect on the accumulated holes given by the interface states between the silicon substrate and silicon oxide film is suppressed. Further, following the storage operation of a predetermined time, a source voltage is outputted as a detection signal voltage according to the reading operation shown in FIG. 29. At this time, about 3V is applied to the gate and about 3V is applied to the drain.

FIG. 30 represents a non-select time and shows the voltage relationship of a common drain line and source line when a pixel of another gate line is read. The drain voltage is about 3V in accordance with the reading of another pixel, the gate voltage is about 0V so that the detection voltage is not outputted to the source, and the detection transistor enters an OFF state. Further, FIG. 31 represents a non-select time and shows the voltage relationship of a common drain line and source line when a pixel of another gate line is reset. High positive voltages, i.e. a drain voltage of 6 to 7 V and a source voltage of 6 to 7 V, are applied in accordance with the resetting of the other pixel. Therefore, a gate voltage of about 0V is applied so that the P well region is not depleted.

Returning now to FIG. 26, explaining the gate VG1, the source voltage according to the accumulated electrical charge is read-out, and the read operation is performed once again after the reset operation by means of a read/reset/read operation. Accordingly, according to correlated double sampling that utilizes the difference of the source voltages before and after resetting, noise accompanied by the variation in the threshold voltage of the detection transistor or the like can be removed. Thereafter, the storage operation is performed until the next read operation. However, when a read/reset/read operation is performed by the other gates VG2, VG3 during the storage operation, the non-selection operation shown in FIGS. 30 and 31 is performed and the storage operation is suspended, whereby the influence of other reading and other resetting is avoided.

As shown in FIG. 26, in the storage state, a pixel must change to a non-selected state (reading of another pixel) in accordance with the reading of a pixel of another gate line. In the storage state, the gate voltage is about 3V and the drain voltage is 1 to 1.5 V. However, in the non-selected state (reading of another pixel), the gate voltage is about 0V, and the drain voltage is about 3V. In this embodiment, by providing the potential pocket region HPK in the whole region below the gate electrode, the area of the P-type well region is reduced and the pixels are miniaturized. However, accordingly, in the storage state where the drain voltage is low 1 to 1.5 V, when the gate voltage drops sharply from 3V to 0V due to the non-selected state, the potential of the N-type buried isolation region N-ISO drops due to capacitive coupling, the potential barrier of the isolation region N-ISO between the P-type substrate Sub and the potential pocket region HPK storing the holes drops too, meaning that there is a danger of the noise charges (holes) coming from the substrate side.

Therefore, in this embodiment, when the transition is made from the storage state to the non-selection (reading of another pixel) state, (1) driving is such that the gate voltage is lowered to 0V after first raising the drain voltage about 3V and increasing the height of the potential of the N-type buried isolation region N-ISO to which the drain voltage is applied. Alternatively, (2) the reduction of the gate voltage is performed stepwise or progressively and the potential barrier of the buried isolation region N-ISO is not reduced as a result of the AC capacitive coupling.

FIG. 32 is a waveform diagram that shows the driving method of this embodiment. FIG. 32A is a waveform diagram showing the driving method of (1) above. When the transition is made from the storage state to the non-selection (reading of another pixel) state, instead of the gate voltage being lowered in a short time from 3V to 0V with the drain voltage remaining in a low state at 1 to 1.5V as indicated by the broken line, the gate voltage is reduced from 3V to 0V after raising the drain voltage to 3V as per the solid line. Thus, because the gate voltage is reduced in a state where the potential barrier of the buried isolation region N-ISO to which the drain voltage has been applied has been raised, it is prevented that noise charges (holes) come in the potential pocket region HPK from the substrate side.

FIG. 32B is a waveform diagram showing the driving method of (2) above. In this method, the gate voltage is first reduced from 3V to 1.5V in a state where the drain voltage is low at from 1 to 1.5V, then the gate voltage is reduced from 1.5V to 0V after raising the drain voltage to 3V. That is, a large drop in the potential barrier of the buried isolation region N-ISO according to AC capacitive coupling is avoided by means of a stepwise reduction of the gate voltage. Alternatively, as indicated by the broken line, the gate voltage may be reduced progressively. As a result of such driving, the influence of AC capacitive coupling can be reduced. Further, in cases where the gate voltage is reduced stepwise or progressively, an increase in the drain voltage may be performed after the gate voltage has reached 0V.

As described above, according to the image sensor of this embodiment, the pixel size can be reduced, the potential depth of the potential pocket region HPK can be made substantially uniform, and the detection sensitivity with respect to a small amount of light can be raised. Further, by adopting the above driving method, noise charges (holes) coming from the substrate side can be prevented. Further, in the image sensor of this embodiment, pixel isolation is made by means of a drain region and the image sensor does not have an isolation structure that utilizes a silicon oxide. Therefore, there is no leak current caused by such an isolation structure and, even though the pixel region is reduced, a drop in the detection sensitivity can be avoided.

What is claimed is:

1. An image sensor having a plurality of pixels, each of which includes a photoelectric conversion element and a detection transistor a threshold voltage of which fluctuates in accordance with electrical charge generated in the photoelectric conversion element, comprising:
    a second conductivity type shield region and a first conductivity type photoelectric conversion region below the shield region that constitute the photoelectric conversion element and are formed in a first conductivity type substrate;
    a first conductivity type well region that is formed in the substrate and linked to the photoelectric conversion region;
    a second conductivity type source region formed in the well region;
    a second conductivity type drain region that is formed surrounding the well region and the photoelectric conversion region;
    a ring-like gate electrode that is formed on the well region and surrounding said source region, and is positioned between said source region and drain region and between said source region and said photoelectric conversion region; and
    a potential pocket region, formed in the well region and below the ring-like gate electrode, for accumulating the electrical charge,
    wherein a width of a first part of the ring-like gate electrode located between the source region and the photoelectric conversion region is formed narrower than a width of a second part of the ring-like gate electrode located between the source region and the drain region.

2. The image sensor according to claim 1, wherein said first part of the ring-like gate electrode and said second part of the ring-like gate electrode are positioned at opposite sides of each other, and extend in the same direction respectively.

3. The image sensor according to claim 1, wherein said potential pocket region is formed in the well region that is positioned below a central portion in a gate length direction of the ring-like gate electrode.

4. An image sensor having a plurality of pixels, each of which includes a photoelectric conversion element and a detection transistor a threshold voltage of which fluctuates in accordance with electrical charge generated in the photoelectric conversion element, comprising:
    a second conductivity type shield region and a first conductivity type photoelectric conversion region below the shield region that constitute the photoelectric conversion element and are formed in a first conductivity type substrate;
    a first conductivity type well region that is formed in the substrate and linked to the photoelectric conversion region;
    a second conductivity type source region formed in the well region;
    a second conductivity type drain region that is formed surrounding the well region and the photoelectric conversion region;
    a ring-like gate electrode that is formed on the well region and surrounding said source region, and is positioned between said source region and said drain region and between said source region and said photoelectric conversion region; and
    a potential pocket region, formed in the well region and below the ring-like gate electrode, for accumulating the electrical charge,
    wherein a width of the potential pocket region in a channel direction of the ring-like gate electrode is formed narrower in a first part adjacent to the photoelectric conversion region than in a second part other than the first part.

5. The image sensor according to claim 4, wherein said first part of the ring-like gate electrode and said second part of the ring-like gate electrode are positioned at opposite sides of each other, and extend in the same direction respectively.

6. The image sensor according to claim 4, wherein said potential pocket region is formed in the well region that is positioned below a central portion in a gate length direction of the ring-like gate electrode.

7. The image sensor according to claim 1 or 4, wherein a second conductivity type isolation region buried in the substrate, that surrounds the well region and the photoelectric conversion region and isolates the well region and photoelectric conversion region from the substrate, and the isolated region is linked to the drain region.

8. The image sensor according to claim 1 or 4, wherein the potential pocket region has substantially a uniform impurity concentration with a ring-like shape that is the same as that of the ring-like gate electrode.

9. The image sensor according to claim 1 or 4, wherein the potential pocket region has substantially a uniform potential depth with a ring-like shape that is the same as that of the ring-like gate electrode.

10. The image sensor according to claim 1 or 4, wherein the potential pocket region has a higher impurity concentration than the well region.

11. The image sensor according to claim 1 or 4, further comprising:

a second conductivity type buried isolation region that is buried between the well region and the substrate and linked to the drain region, wherein the buried isolation region is formed in a shape that includes the gate electrode from a planar perspective.

* * * * *